US009206524B2

(12) United States Patent
Zhang et al.

(10) Patent No.: US 9,206,524 B2
(45) Date of Patent: Dec. 8, 2015

(54) CONDUCTIVITY BASED ON SELECTIVE ETCH FOR GAN DEVICES AND APPLICATIONS THEREOF

(75) Inventors: Yu Zhang, Princeton, NJ (US); Qian Sun, Woodbridge, CT (US); Jung Han, Woodbridge, CT (US)

(73) Assignee: Yale University, New Haven, CT (US)

( * ) Notice: Subject to any disclaimer, the term of this patent is extended or adjusted under 35 U.S.C. 154(b) by 400 days.

(21) Appl. No.: 13/559,199

(22) Filed: Jul. 26, 2012

(65) Prior Publication Data

US 2013/0011656 A1 Jan. 10, 2013

Related U.S. Application Data

(63) Continuation-in-part of application No. PCT/US2011/022701, filed on Jan. 27, 2011.

(60) Provisional application No. 61/385,300, filed on Sep. 22, 2010, provisional application No. 61/371,308, (Continued)

(51) Int. Cl.
*C25F 3/12* (2006.01)
*C25B 1/00* (2006.01)
*H01L 21/306* (2006.01)
(Continued)

(52) U.S. Cl.
CPC . *C25F 3/12* (2013.01); *C25B 1/003* (2013.01); *H01L 21/02005* (2013.01); *H01L 21/306* (2013.01); *H01L 21/30635* (2013.01); *C30B 29/406* (2013.01); *H01L 33/0062* (2013.01); *H01L 33/32* (2013.01); *Y10T 428/24997* (2015.04)

(58) Field of Classification Search
CPC .......................................................... C25F 3/12
USPC .......................................................... 205/640
See application file for complete search history.

(56) References Cited

U.S. PATENT DOCUMENTS 5,644,156 A 7/1997 Suzuki et al.
7,750,234 B2 * 7/2010 Deng et al. ............... 136/252
(Continued)

FOREIGN PATENT DOCUMENTS

CN 101443887 A 5/2009
JP H10135500 A 5/1998
(Continued)

OTHER PUBLICATIONS

International Search Report, PCT/US11/22701, mailed Apr. 8, 2014.
(Continued)

*Primary Examiner* — Nicholas A Smith
(74) *Attorney, Agent, or Firm* — Wolf, Greenfield & Sacks, P.C.

(57) ABSTRACT

This invention relates to methods of generating NP gallium nitride (GaN) across large areas (>1 cm²) with controlled pore diameters, pore density, and porosity. Also disclosed are methods of generating novel optoelectronic devices based on porous GaN. Additionally a layer transfer scheme to separate and create free-standing crystalline GaN thin layers is disclosed that enables a new device manufacturing paradigm involving substrate recycling. Other disclosed embodiments of this invention relate to fabrication of GaN based nanocrystals and the use of NP GaN electrodes for electrolysis, water splitting, or photosynthetic process applications.

51 Claims, 21 Drawing Sheets

Related U.S. Application Data filed on Aug. 6, 2010, provisional application No. 61/369,333, filed on Jul. 30, 2010, provisional application No. 61/369,306, filed on Jul. 30, 2010, provisional application No. 61/369,274, filed on Jul. 30, 2010, provisional application No. 61/369,322, filed on Jul. 30, 2010, provisional application No. 61/369,287, filed on Jul. 30, 2010, provisional application No. 61/347,001, filed on May 21, 2010, provisional application No. 61/347,054, filed on May 21, 2010, provisional application No. 61/326,722, filed on Apr. 22, 2010, provisional application No. 61/298,788, filed on Jan. 27, 2010.

(51) Int. Cl.
  *H01L 21/3063* (2006.01)
  *H01L 21/02* (2006.01)
  *H01L 33/00* (2010.01)
  *H01L 33/32* (2010.01)
  *C30B 29/40* (2006.01)

(56) References Cited

U.S. PATENT DOCUMENTS

| | | | |
|---|---|---|---|
| 2002/0070125 A1* | 6/2002 | Ng et al. | 205/640 |
| 2005/0029224 A1 | 2/2005 | Aspar et al. | |
| 2005/0184307 A1 | 8/2005 | Li et al. | |
| 2006/0199353 A1 | 9/2006 | Kub et al. | |
| 2007/0085100 A1 | 4/2007 | Diana et al. | |
| 2007/0284607 A1 | 12/2007 | Epler et al. | |
| 2008/0280140 A1* | 11/2008 | Ferrari et al. | 428/402 |
| 2008/0296173 A1 | 12/2008 | Mishra et al. | |
| 2009/0001416 A1 | 1/2009 | Chua et al. | |
| 2009/0143227 A1 | 6/2009 | Dubrow et al. | |

FOREIGN PATENT DOCUMENTS

| | | |
|---|---|---|
| JP | 2001223165 A | 8/2001 |
| JP | 200967658 A | 9/2010 |
| WO | WO 2005066612 A2 | 7/2005 |
| WO | WO 2009048265 A1 | 4/2009 |

OTHER PUBLICATIONS

International Search Report dated Apr. 8, 2011 and Written Opinion from related International Application No. PCT/US11/22701.

Chinese Office Action dated Nov. 4, 2014 from corresponding Chinese Application No. 201180007613.2.

Japanese Office Action dated Nov. 10, 2014 from corresponding Japanese Application No. 2012-551282.

* cited by examiner

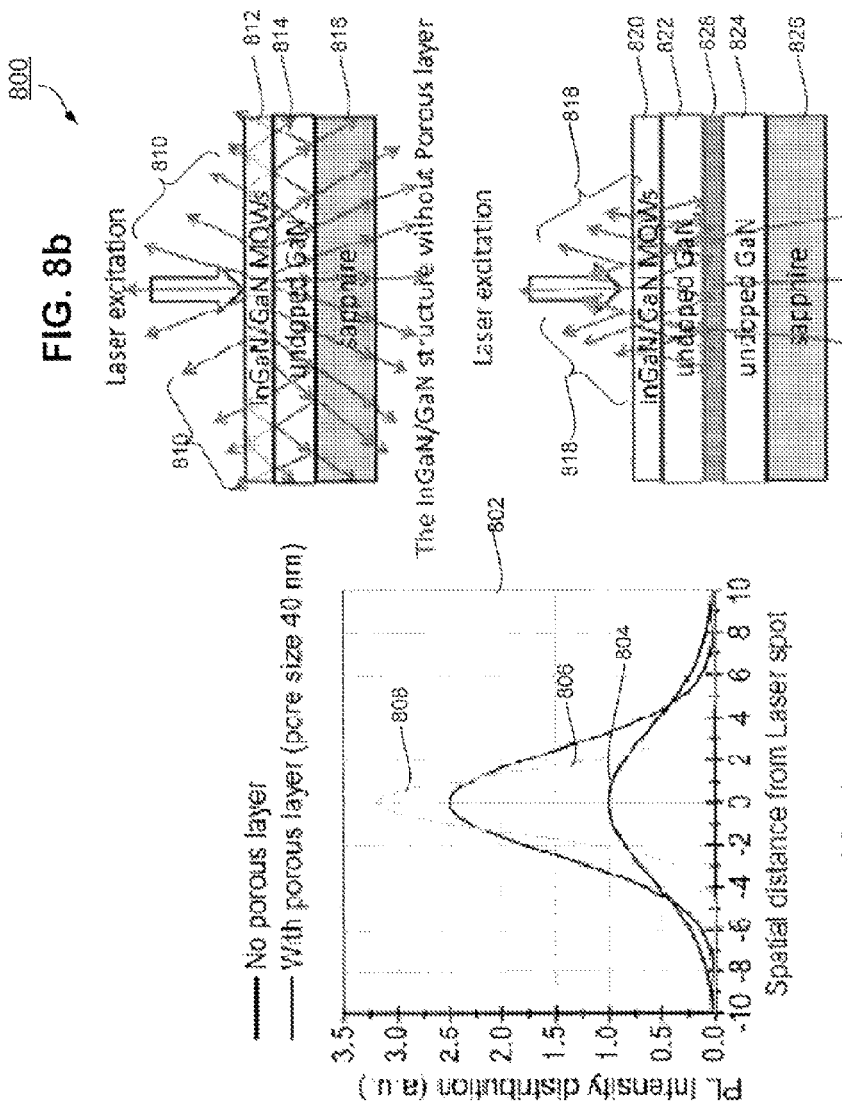

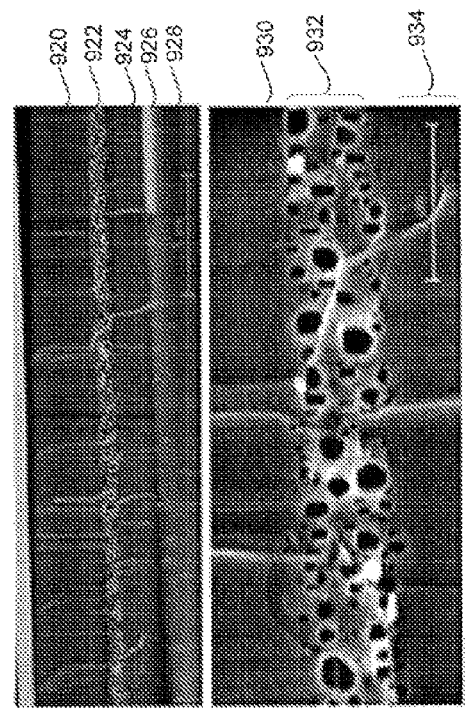
FIG. 9c
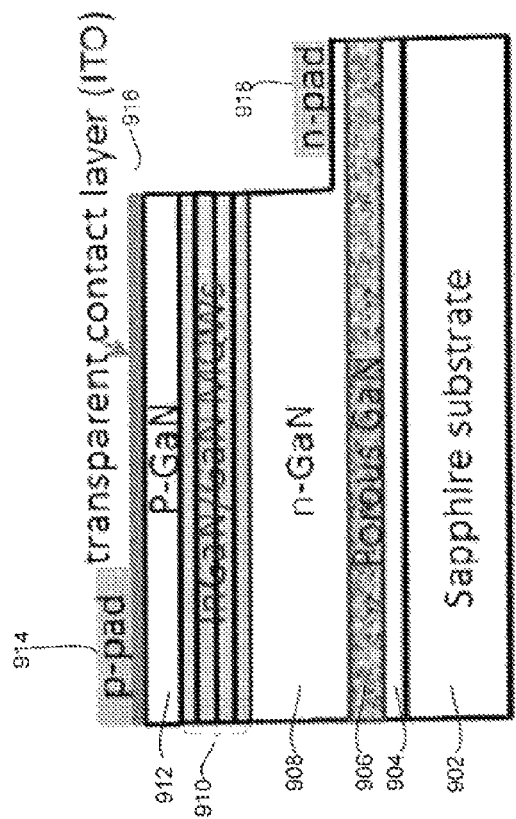
FIG. 9b
FIG. 9a

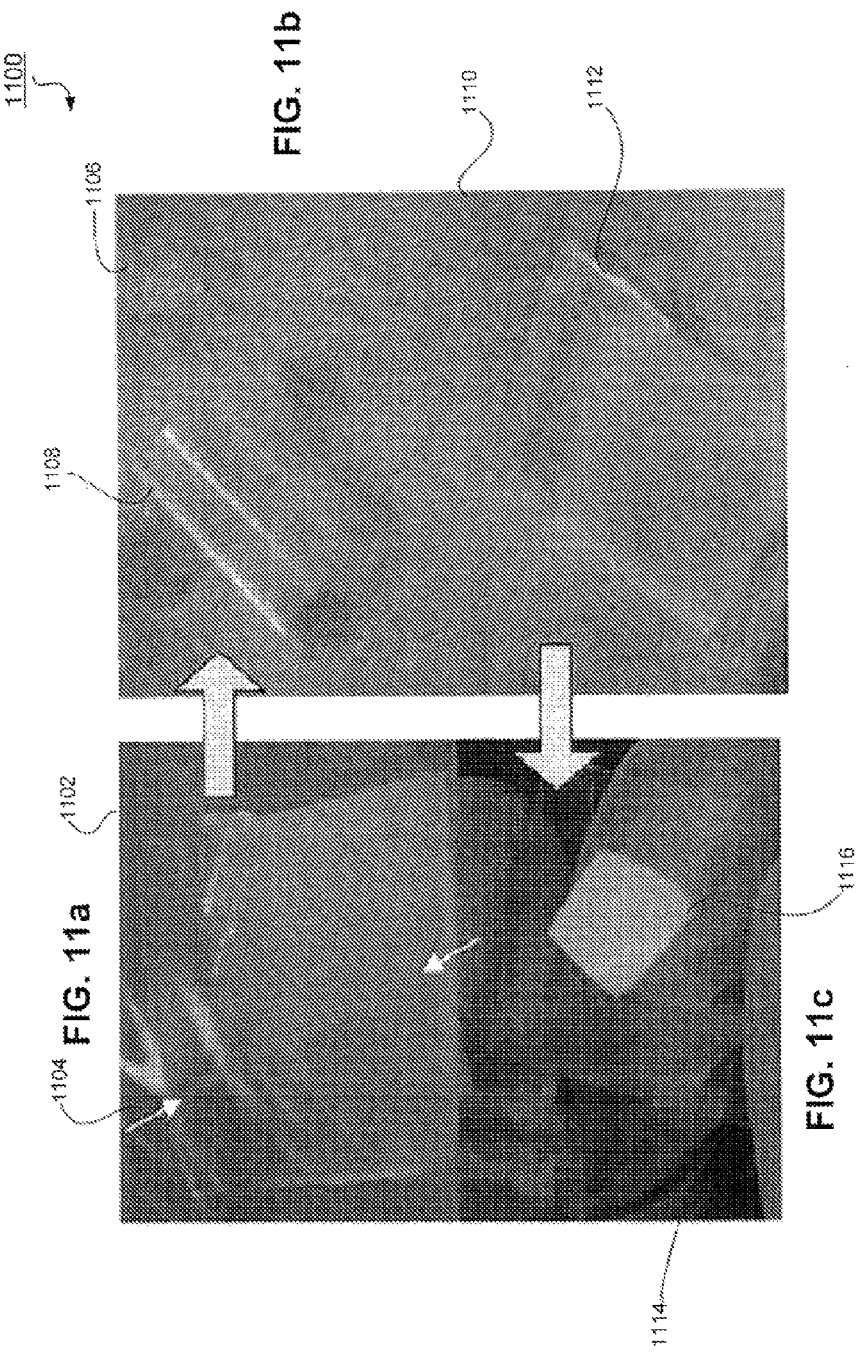

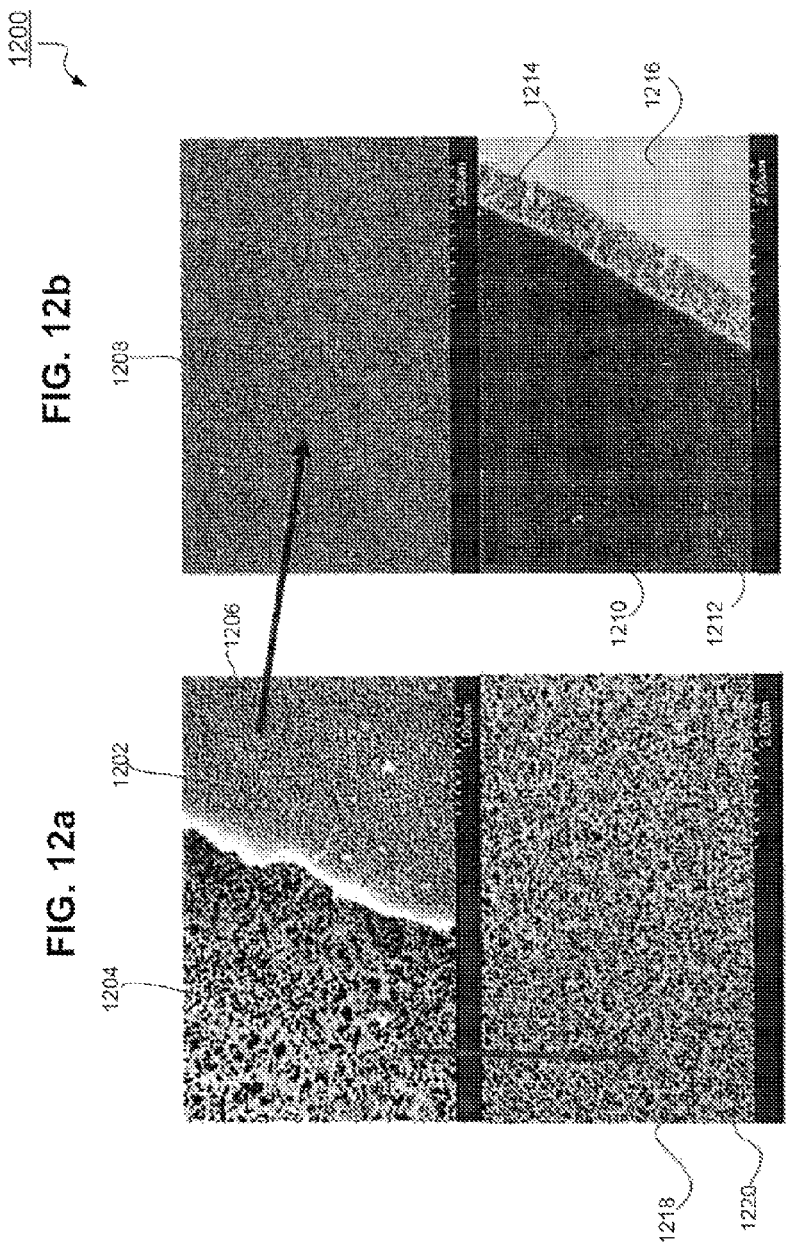

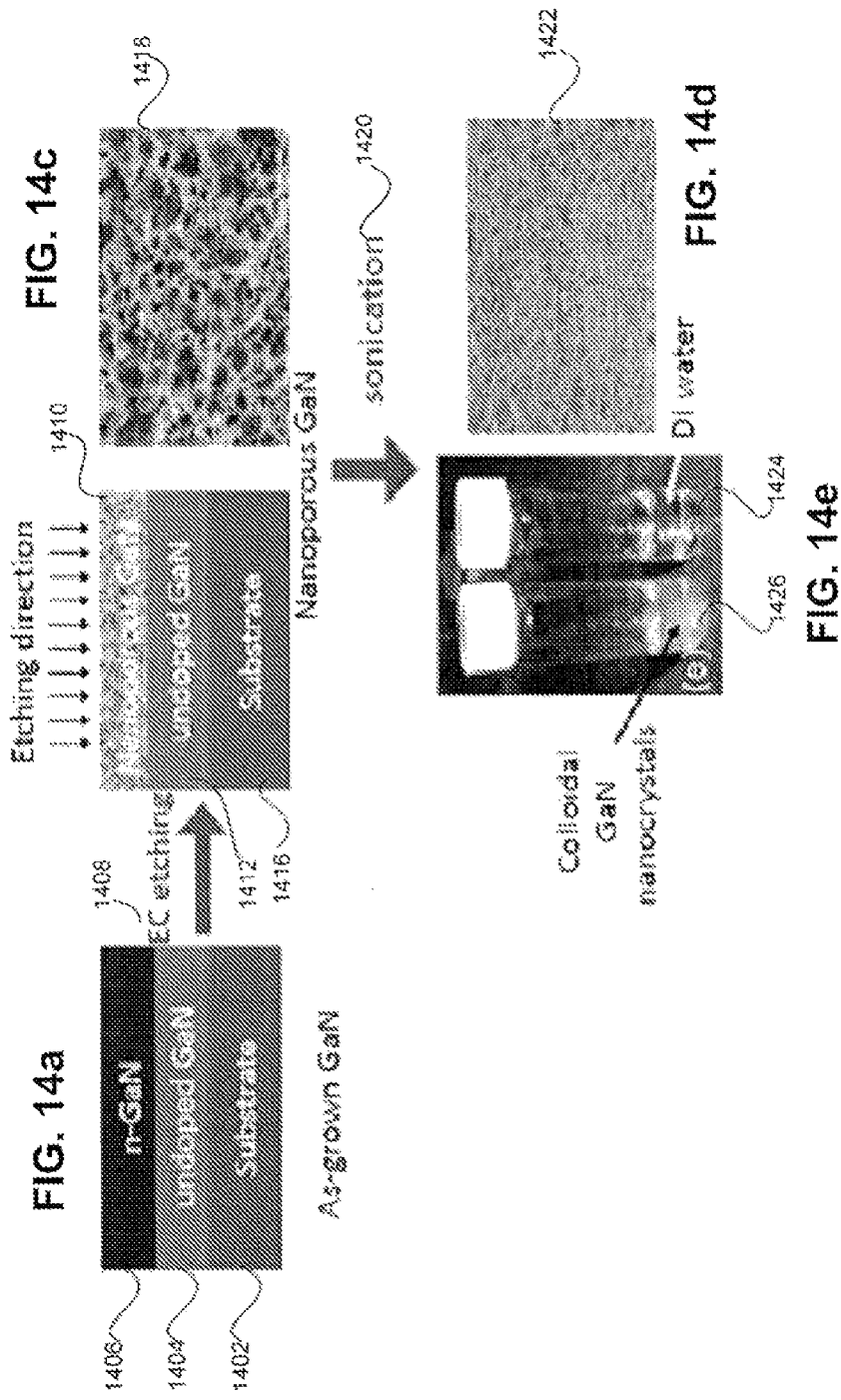

US 9,206,524 B2

CONDUCTIVITY BASED ON SELECTIVE ETCH FOR GAN DEVICES AND APPLICATIONS THEREOF

CROSS-REFERENCE TO RELATED APPLICATIONS

This application is a continuation-in-part of International Patent Application No. PCT/US2011/022701, filed on Jan. 27, 2011, which claims the benefit of each of U.S. Provisional Patent Application No. 61/298,788, filed on Jan. 27, 2010; U.S. Provisional Patent Application No. 61/326,722, filed on Apr. 22, 2010; U.S. Provisional Patent Application No. 61/347,001, filed on May 21, 2010; U.S. Provisional Patent Application No. 61/347,054, filed on May 21, 2010; U.S. Provisional Patent Application No. 61/369,274, filed on Jul. 30, 2010; U.S. Provisional Patent Application No. 61/369,287, filed on Jul. 30, 2010; U.S. Provisional Patent Application No. 61/369,306, filed on Jul. 30, 2010; U.S. Provisional Patent Application No. 61/369,322, filed on Jul. 30, 2010; U.S. Provisional Patent Application No. 61/369,333, filed on Jul. 30, 2010; U.S. Provisional Patent Application No. 61/371,308, filed on Aug. 6, 2010; and U.S. Provisional Patent Application No. 61/385,300, filed on Sep. 22, 2010. All of the foregoing applications are incorporated by reference herein in their entireties.

STATEMENT REGARDING FEDERALLY-SPONSORED RESEARCH AND DEVELOPMENT

Part of the work performed during development of this invention utilized U.S. Government funds under grants DE-FC26-07NT43227, DE-FG0207ER46387, and DE-SCOOO1134 awarded by the U.S. Department of Energy. The U.S. Government has certain rights in this invention.

BACKGROUND OF THE INVENTION

1. Field of the Invention

This invention relates to the field of processing of GaN based semiconductor materials and forming devices therefrom.

2. Background Art

In the field of semiconductor processing, considerable attention has been paid to the development of porous silicon materials for their beneficial optical and mechanical properties. Porous silicon is typically generated using a wet electrochemical etching process.

Another material of great interest is GaN. The importance of GaN devices in display, data storage, and lighting applications has been clearly established. Over the past two decades the epitaxy of GaN has been explored in depth, but a flexible wet etching procedure is still sought.

BRIEF SUMMARY OF THE INVENTION

The present invention is directed to methods for generating nanoporous NP GaN. One method according to the present invention comprises: exposing GaN to an electrolyte, coupling the GaN to one terminal of a power supply and an electrode, immersed in the electrolyte, to another terminal of the power supply to thereby form a circuit; and energizing the circuit to increase the porosity of at least a portion of the GaN. Accordingly, a material with tunable optical and mechanical properties is produced that can be used in a number of semiconductor-based electronic and optical applications. Methods are also provided for controlling the porosity of GaN to generate useful optical structures such as a distributed Bragg reflector, Fabry-Perot optical filter, and a light emitting diode with enhanced light extraction properties. Also provided are device manufacturing methods using NP GaN substrates and methods for separating NP GaN layers and devices. Lastly, methods are provided for generating nanocrystals from NP GaN and for generating NP GaN electrodes for electrolysis, water splitting, or photosynthetic process applications.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIGS. 3a-d illustrate SEM micrographs of NP GaN resulting from the EC process, according to an embodiment of the invention.

Figures 4A, 4B:
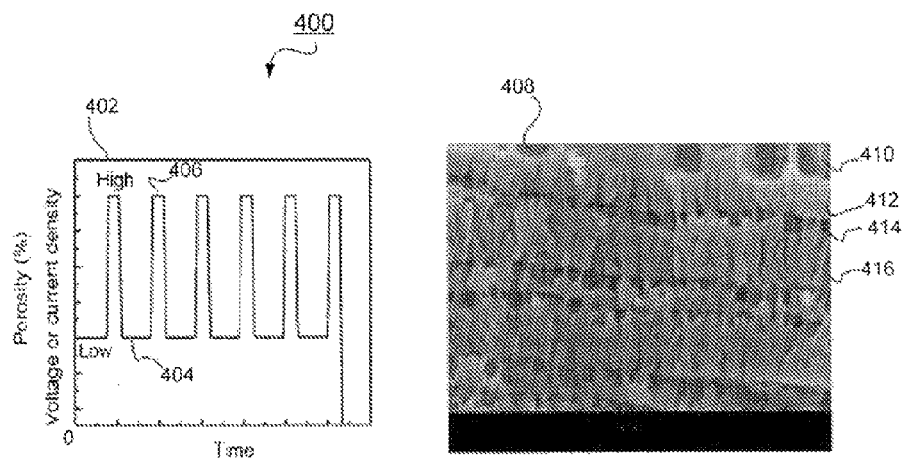

FIGS. 4a and 4b illustrate a multi-layer NP GaN structure resulting from switching from a low to high voltage repeatedly during the EC process, according to an embodiment of the invention.

Figure 5A:
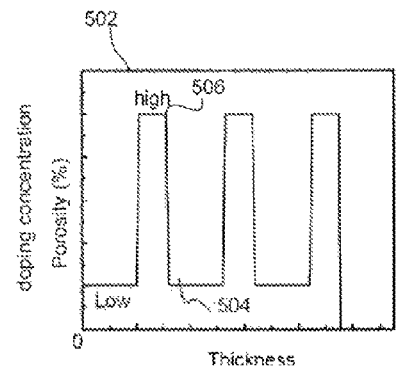
Figure 5B:
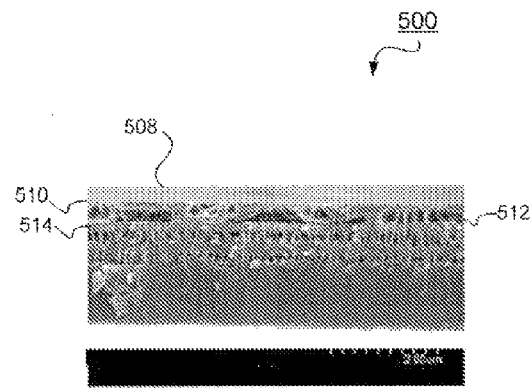

FIGS. 5a and 5b illustrate another multi-layer NP GaN structure resulting from a multi-layer doping profile used in the EC process, according to an embodiment of the invention.

Figure 6A:
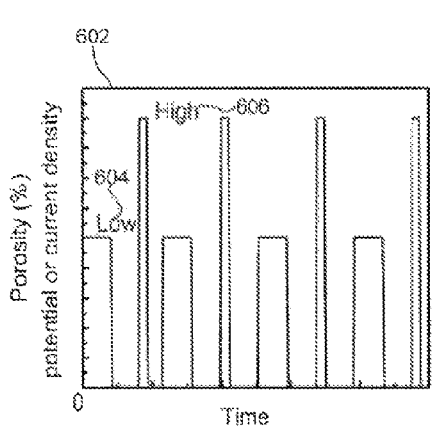
Figure 6B:
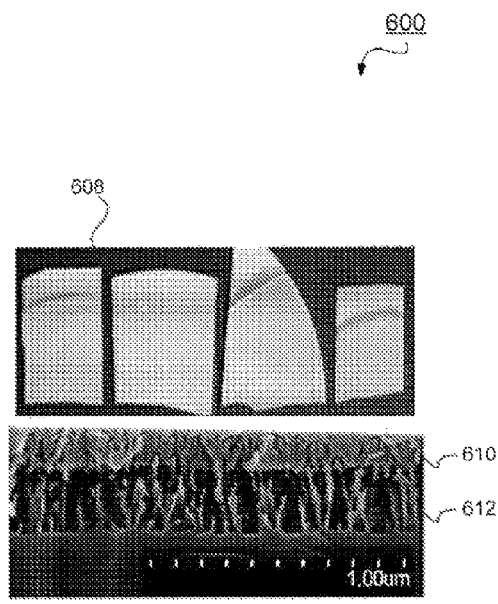

FIGS. 6a and 6b illustrate a more complicated multi-layer NP GaN structure resulting from the EC process, according to an embodiment of the invention.

Figure 7:
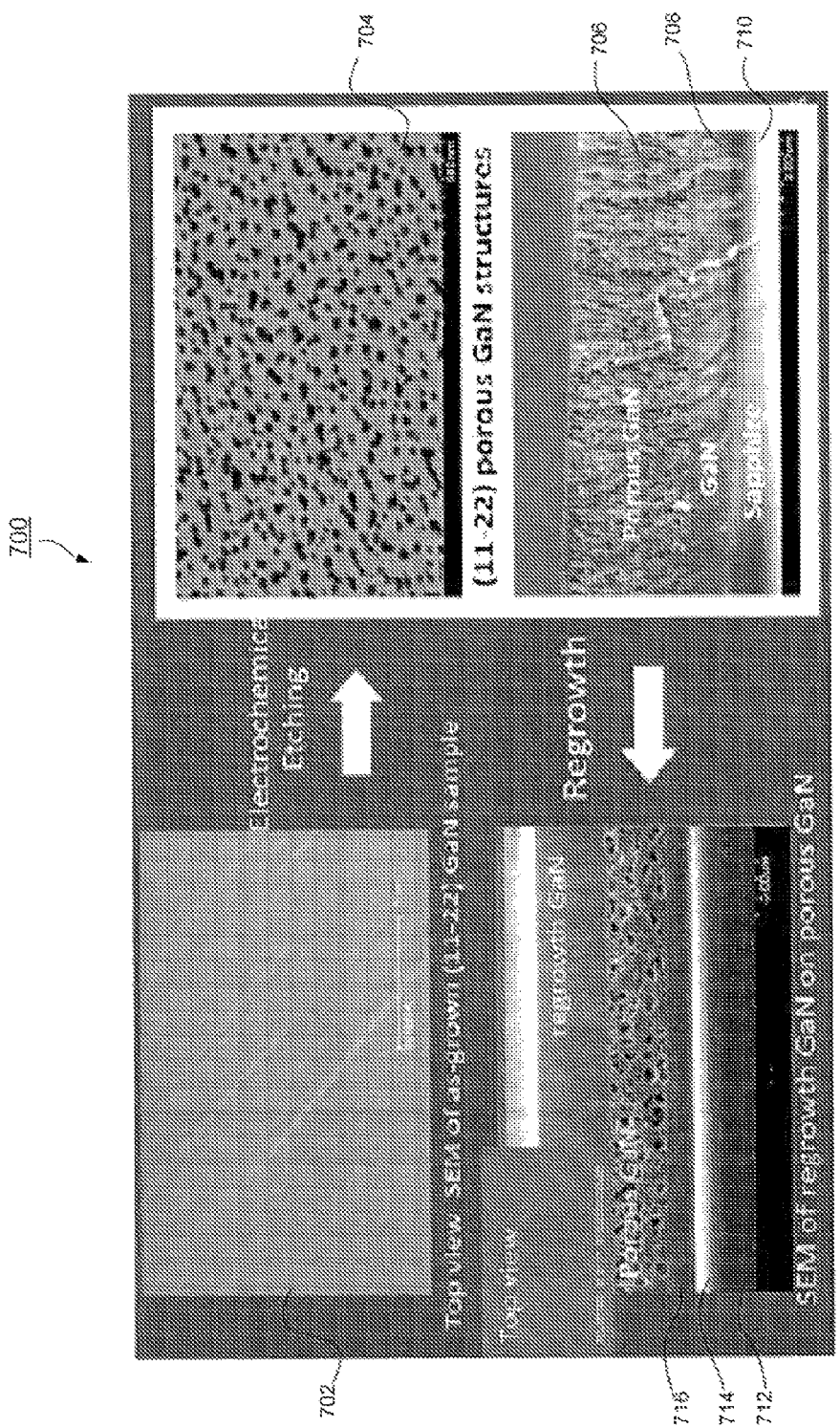

FIG. 7 illustrates the process of GaN regrown on NP GaN, according to an embodiment of the invention.

FIGS. 8a-c illustrate the principle of enhanced light extraction from an LED device with a buried NP GaN layer, according to an embodiment of the invention.

FIG. 9a-c illustrate an LED device structure with a buried NP GaN layer, fabricated according to an embodiment of the invention.

FIGS. 10a-h illustrate two approaches used to separate a NP GaN continuous crystalline layer from a bulk substrate, according to an embodiment of the invention.

FIGS. 11a-c illustrate the complete separation of a continuous crystalline layer from a bulk substrate in an electrolyte, according to an embodiment of the invention.

FIG. 12a-d illustrate plane-view SEM images: (a) at the breakage of NP GaN membrane from the substrate, (b) the surface of a NP GaN membrane, (c) the surface of exposed underlying GaN, and (d) inclined view from an edge of a free-standing GaN membrane. These materials were generated according to embodiments of the invention.

Figure 13:
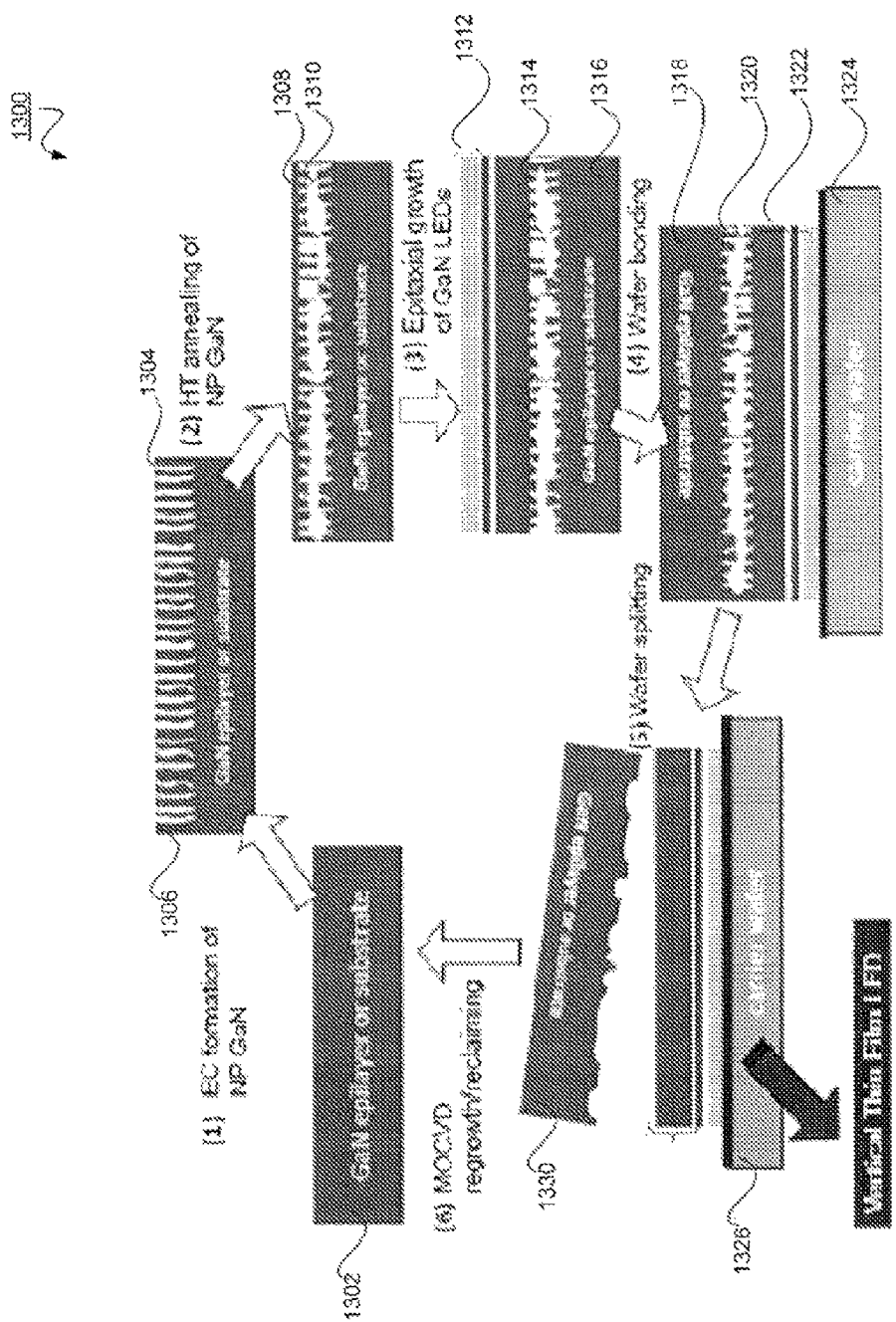

FIG. 13 is a schematic drawing of a route to fabricating vertical thin-film devices and recycling/reclaiming GaN and other substrates, according to an embodiment of the invention.

FIGS. 14a-e illustrate a first process for making GaN nanocrystals, according to an embodiment of the invention.

Figure 15C:
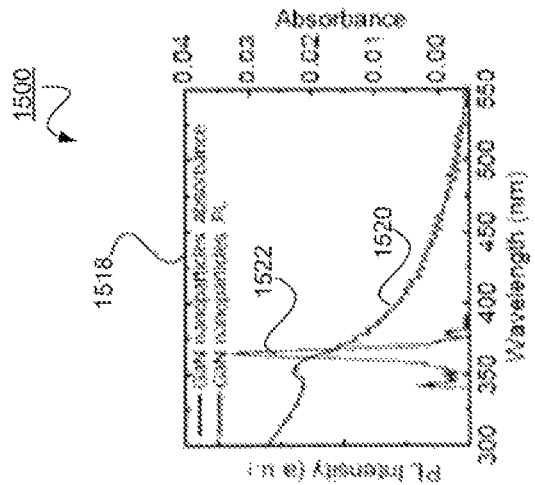
Figure 15B:
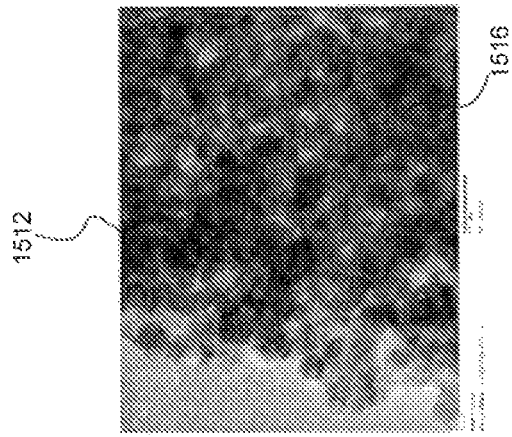
Figure 15A:
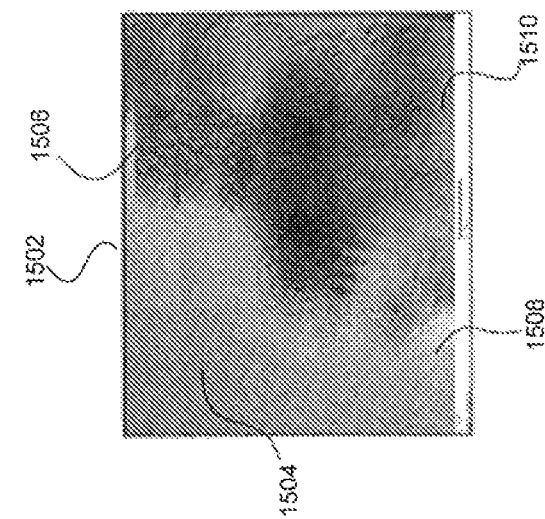

FIGS. 15a-c illustrate: (a) high-resolution TEM images of individual GaN nanocrystals, (b) GaN particulates from the aggregation of GaN nanocrystals, and (c) photoluminescence and absorbance measurements from GaN nanocrystals, according to an embodiment of the invention.

Figures 16A, 16B:
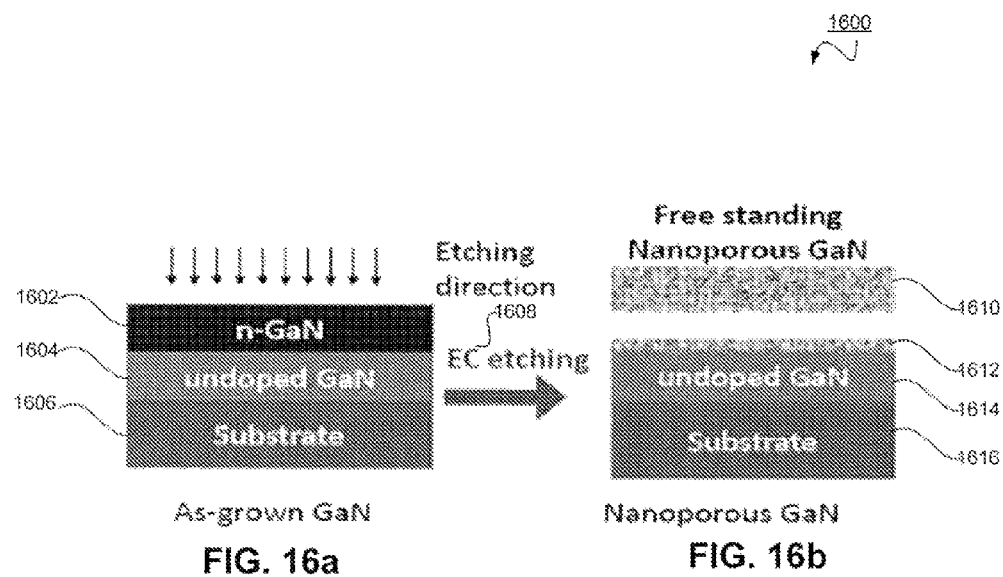

FIGS. 16a and 16b illustrate a second process for making GaN nanocrystals involving a NP membrane, according to an embodiment of the invention.

Figures 17A, 17B, 17C:
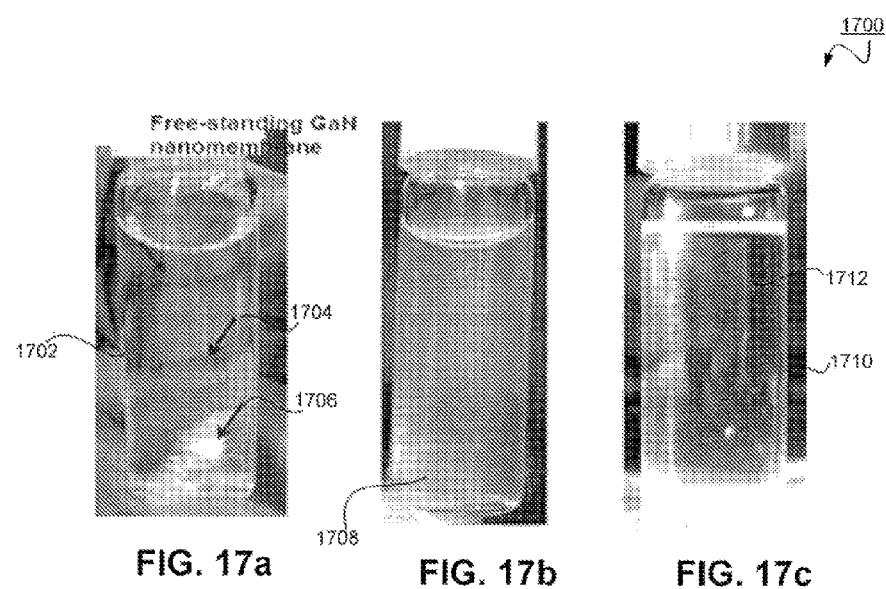

FIGS. 17a-c show: (a) a picture of free-standing GaN membrane/film in solution, including one large sheet (pointed by the upper two arrows) and smaller pieces and flakes (bottom arrow), (b) after one hour of sonication, and (c) luminescence photo of colloidal GaN nanocrystals under UV light, according to an embodiment of the invention.

Figure 18:
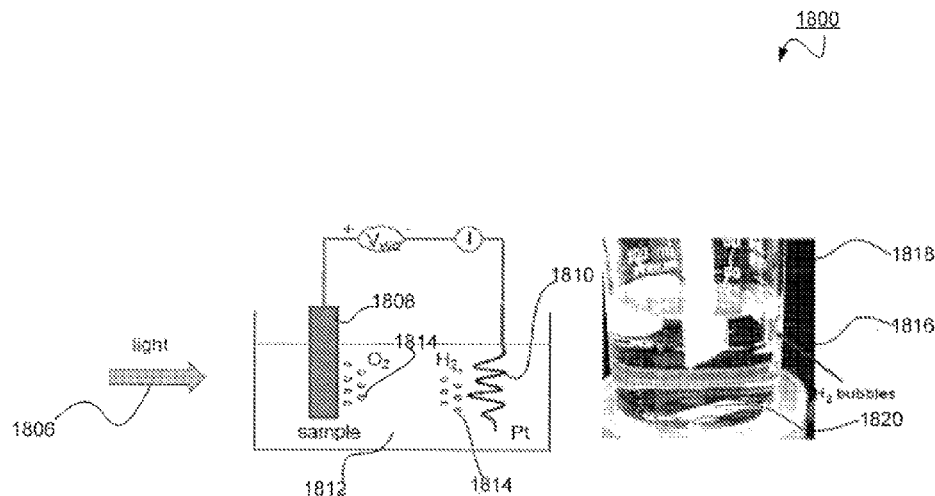

FIG. 18 is an illustration of the apparatus used in water splitting experiments using a NP GaN electrode, according to an embodiment of the invention.

Figure 19:
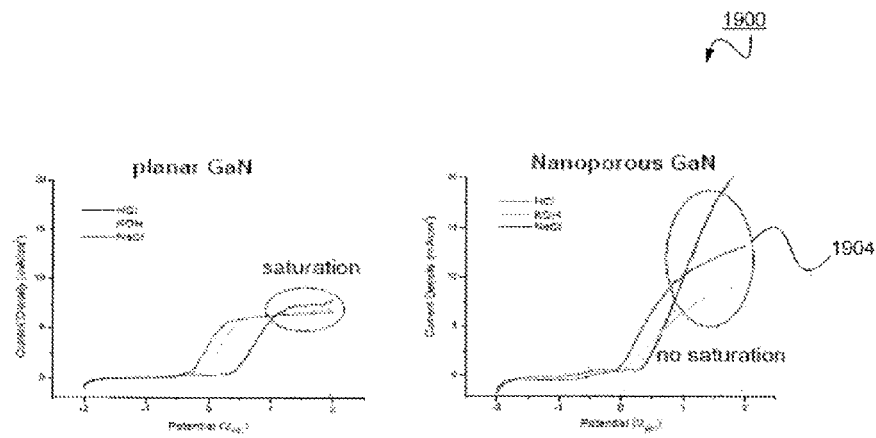

FIG. 19 illustrates the beneficial use of a NP GaN electrode in a water splitting experiment resulting in reduced current density saturation, according to an embodiment of the invention.

Figure 20:
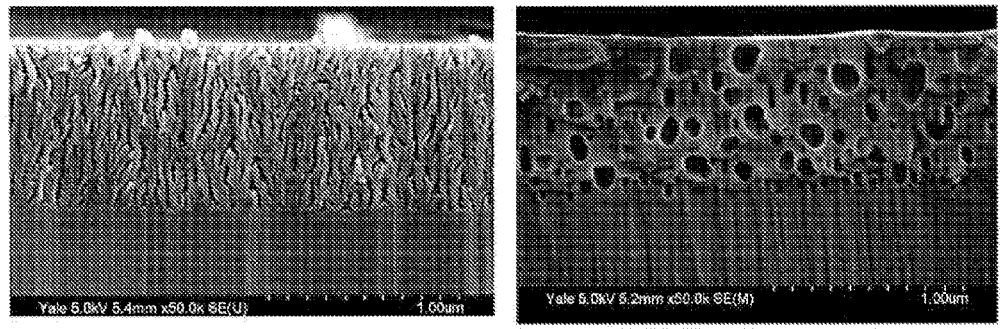

FIG. 20 illustrates a cross-sectional SEM of nanoporous GaN before (left) and after (right) a high temperature annealing.

Figure 21:
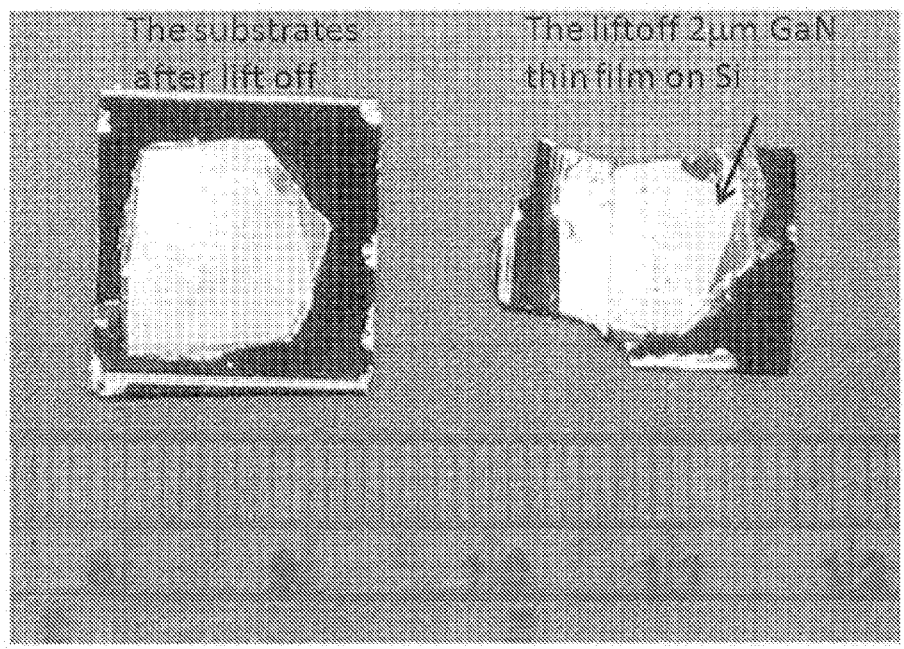

FIG. 21 illustrates optical images after liftoff GaN.

Figure 22:
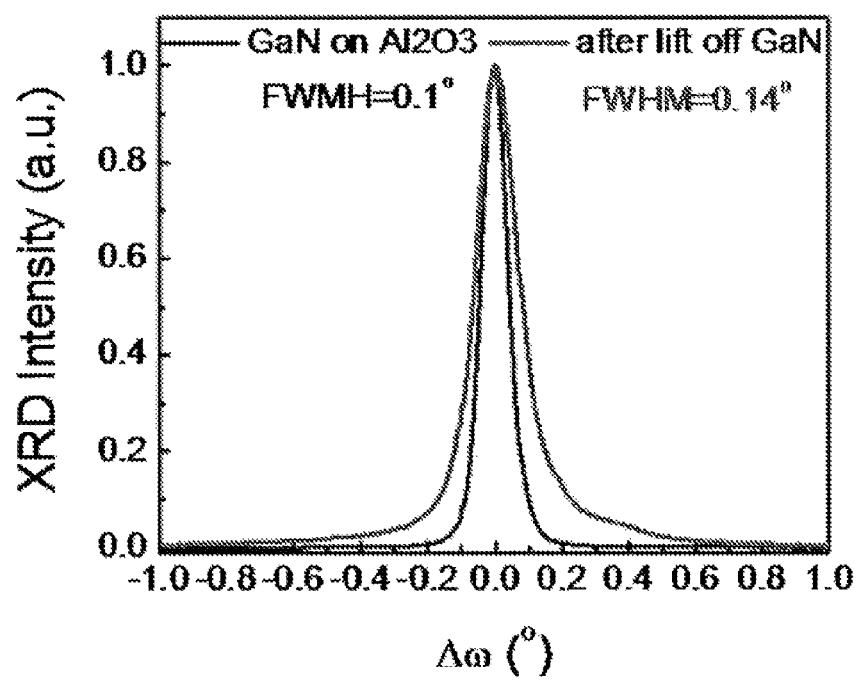

FIG. 22 illustrates X-ray rocking curves of GaN before and after lift-off.

Figure 23:
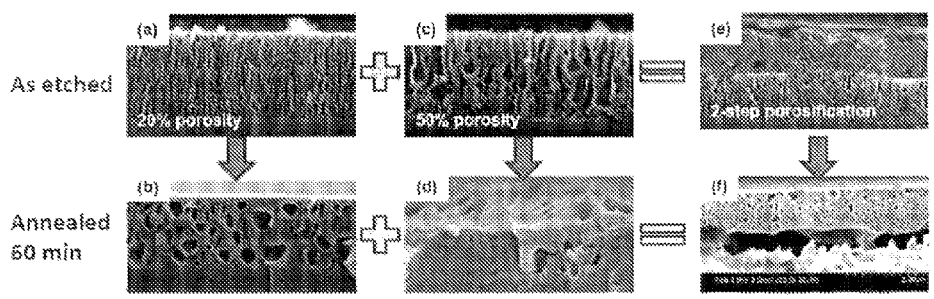

FIG. 23 illustrates a summary of as-etched (a, c, and e) and transformed (b, d, 0 NP GaN samples.

Figure 24:
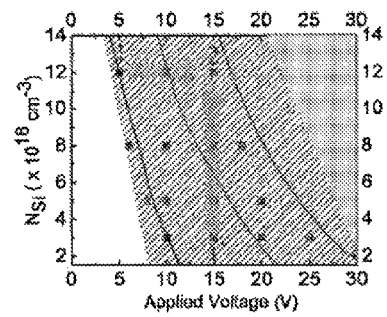

FIG. 24 is a mapping of the "phase diagram" of the EC etching for GaN based on the observed surface morphology.

Figure 25:
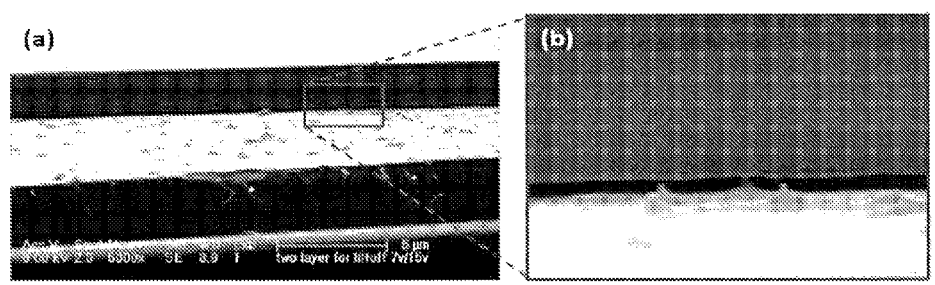

FIG. 25 illustrates (a) Inclined SEM image at a region where a portion of the tethered upper layer was intentionally removed to reveal the underlying nanoposts. (b) a close-up view of the underlying layer surface and the nearly ideal airgap that will be used for LED lift-off.

Figure 26:
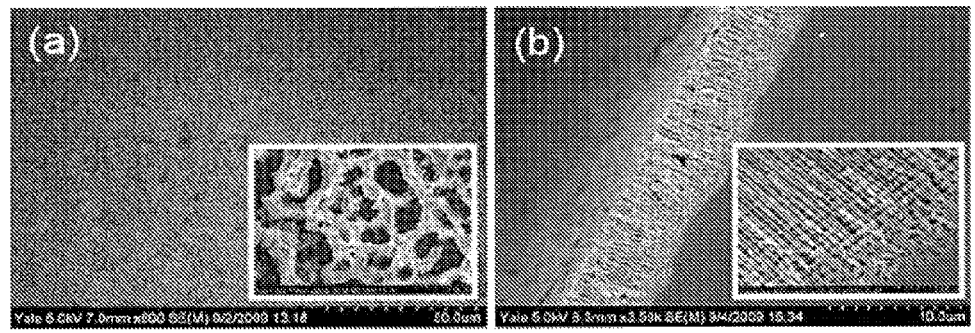

FIG. 26 illustrates plane-view (a) and inclined view (b) of EC porosified bulk GaN wafer (from Furukawa). The insets show close-ups of the respective images.

Figure 27:
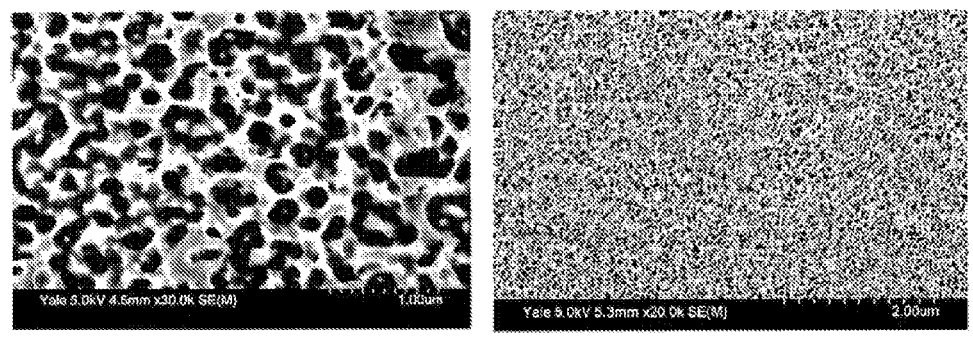

FIG. 27 illustrates a top view SEM of nanoporous GaN after liftoff top overgrowth GaN layer by epitaxial liftoff (left) and after liftoff GaN epilayer by electrochemical etching (right).

Figure 28:
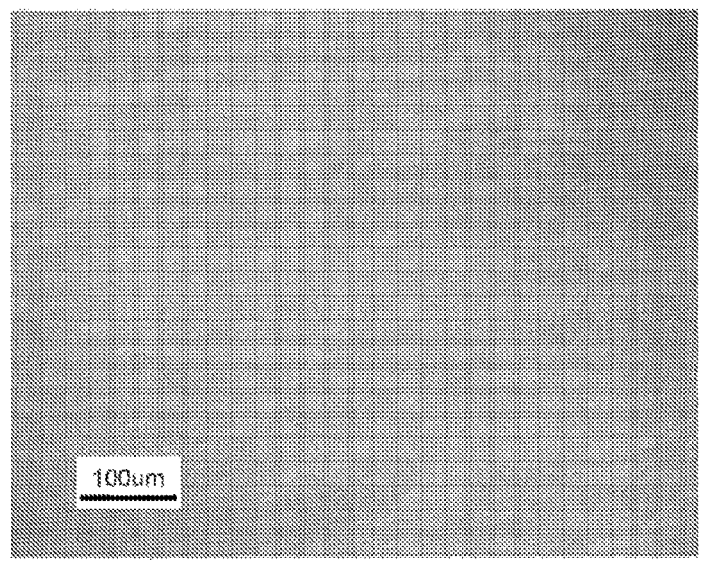

FIG. 28 illustrates optical images of GaN grown on recycled substrate.

Figure 29:
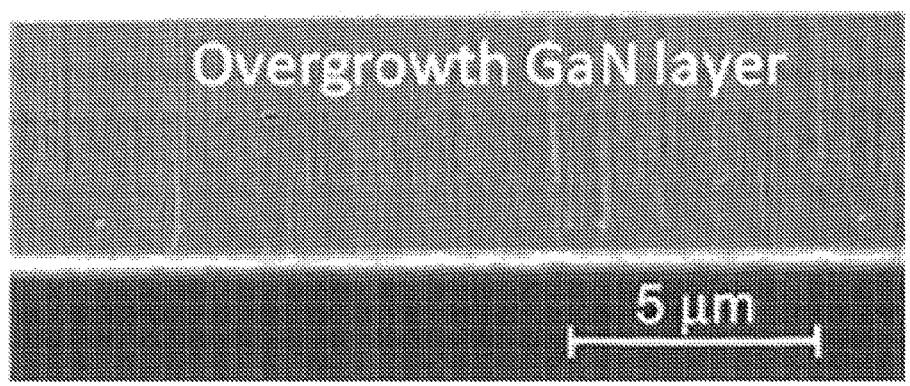

FIG. 29 illustrates a cross-section SEM image of GaN grown on recycled substrate.

Figure 30:
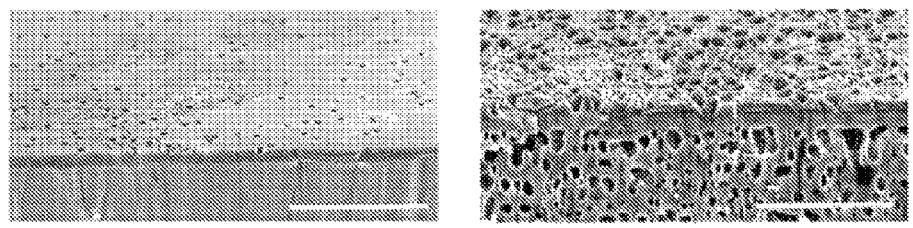

FIG. 30 illustrates inclined SEM images of InGaN epilayers (0.2 μm) grown directly on (left) planar GaN template, and (right) on a nanoporous GaN template. The samples were grown side by side in the same run. The scale bar is 2 μm.

Figure 31:
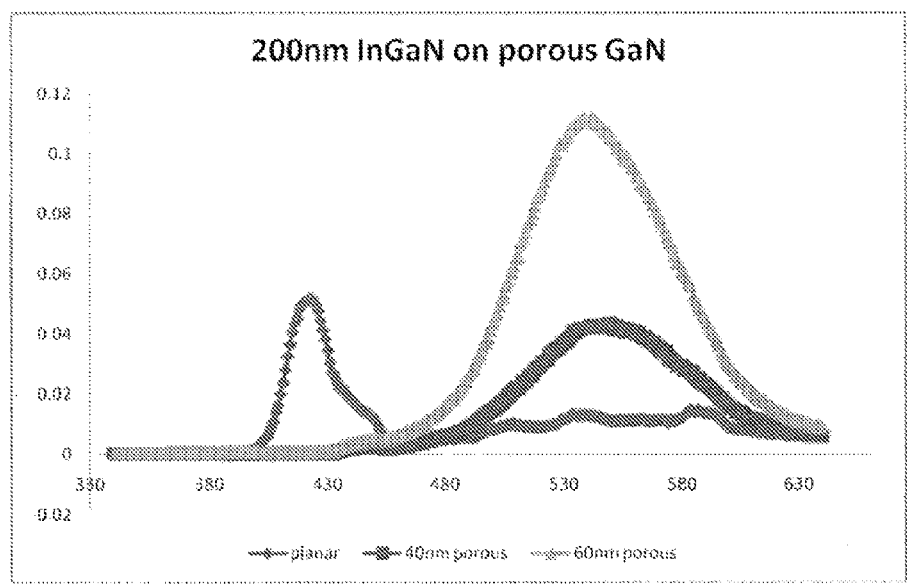
Figure 32:
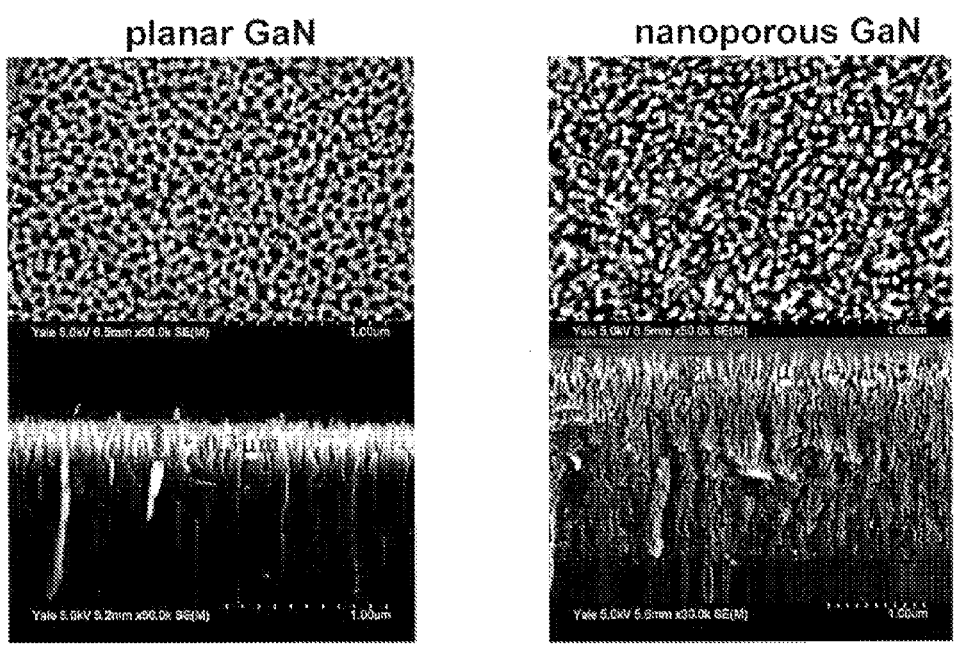

FIG. 31 illustrates RT-PL spectra of 200 nm InGaN grown on planar and NP GaN templates by MOCVD FIG. 32 illustrates SEM images of gallium nitride and nanoporous gallium nitride as photoanodes after water splitting.

DETAILED DESCRIPTION OF THE INVENTION

Methods of Generating Porous GaN

This invention provides methods of generating nanoporous (NP) gallium nitride (GaN) across large areas (e.g., greater than one square centimeter) with controlled pore diameters, pore density, and porosity. In addition, these methods are equally applicable for generating NP GaN over smaller areas.

Although GaN is emphasized throughout this specification, these techniques are also applicable to other III-nitride systems such as InGaN. Thus the term "GaN" should be broadly interpreted throughout the specification to mean any III-nitride material such as InGaN, AlGaN, etc. Thus the phrase "NP GaN" can also be interpreted as "NP InGaN" etc.

Nanoporous GaN has great potential for use in re-growth, micro-machining, chemical sensing, and other applications such as semiconductor electronic and optical device manufacturing. It also has applicability for use in nanotechnology applications as described herein. The methods disclosed here can be used to directly produce planar GaN wafers with no need of UV-laser, reactive ion etching, or the like. The methods disclosed are robust and compatible with existing semiconductor manufacturing techniques.

Nanoporous GaN is considered to be a new member of the family of III-nitride compounds. It possesses high crystallinity and optoelectronic quality despite its considerably increased surface area. Several important physical properties are summarized as follows: (1) NP GaN is electrically conducting with measured conductivities comparable to n-type GaN, an attribute important for electrical injection devices, (2) the optical index of refraction can be tuned with porosity for optical confinement and engineering, (3) the elastic compliance (or stiffness) can be modified greatly (sponge-like behavior) while maintaining its single-crystalline nature, and (4) over-growth or re-growth on NP GaN can be carried out in a homoepitaxial manner where the NP surface can be 'sealed up' into atomic smoothness in less than 10 nm of GaN growth while the NP nature can still be preserved.

III-Nitride materials are of interest for optical devices (LED, laser) and electronic devices (Enhancement mode and depletion mode HEMTs) due to its special properties (wide direct bandgap, high electrical field drift speed, large thermal conductivity). The presence of high quality III-Nitride materials and devices are c-plane Gallium-polar and Nitrogen-polar III-Nitride, which grown on c-plane sapphire, or Silicon Carbide (SiC). But c-plane III-Nitride materials system has a very strong polarization (spontaneous and piezoelectric polarization), which affects the performance of optical devices (LED, laser etc.), and the Enhancement mode HEMTs. In contrast, nonpolar (a-plane, m-plane) and semipolar (11-22, 20-21, etc) III-Nitride system has no or weak polarization. But the quality of nonpolar and semipolar III-Nitride materials are still poor (high dislocation and stacking faults density, rough surface). In order to improve the quality of nonpolar and semipolar III-Nitride, ELO, interlayer, homoepitaxy, etc. methods were used. In this invention, use porous structures are used as substrate to grow high quality nonpolar and semipolar III-Nitride materials, and to make high performance optical and electrical devices (LED, laser, HEMTs, etc.), and to make the large area nonpolar and semipolar III-Nitride bulk substrates, and reduce the cost.

First, to grow GaN thin film on sapphire (or III-Nitride, SiC, Si, ZnO, LiNbO3, LiAlO2, etc.). Then, to prepare nanoporous (porous) III-Nitride structures by electrochemical etching in acid or alkali solution (e.g. Oxalic Acid(C2O2 (OH)2), KOH, NaOH, HF, HCl, HBr, etc.), followed by high quality III-Nitride thin film regrowth on nanoporous structures by MOCVD or HVPE after proper cleaning. Finally, to fabricate high performance optical and electrical devices (LED, LD, HEMTs, etc.) on high quality III-Nitride material, or separating the high quality III-Nitride thin film from the nanoporous substrates. Nanoporous GaN shows good electrical conductivity, comparable to as-grown GaN.

Nanoporous GaN. A new member of III-nitrides. Epitaxial single-crystalline with strain relaxed. Good electrical conductivity—vertical LED. Reduced index of refraction—light extraction. Effective in defect filtering—quality improvement. Reduced bonding strength—substrate liftoff. Reduced mechanical stiffness—compliant. High surface/volume ratio. None-dependent on crystallographic orientations.

According to embodiments of the present invention, a heavily doped (i.e., $10^{17}$ to $10^{19}$ cm$^{-3}$) GaN can be selectively removed by an electrochemical (EC) etching with an electrolyte. Both horizontal and vertical etching processes are possible. Horizontal etching starts with epitaxial growth of an n-type doped GaN layer underneath an undoped GaN top layer. Dry etching or cleaving is then employed to expose the sidewalls of the bi- or multi-layer structures. Electrochemical etching then proceeds horizontally and selectively through the n-type GaN underlayers to achieve the undercutting. This invention describes methods of vertical etching of a planar n-type GaN from the surface, where the etching propagates in a direction generally perpendicular to the wafer surface. These methods are disclosed in detail below.

Figure 1:
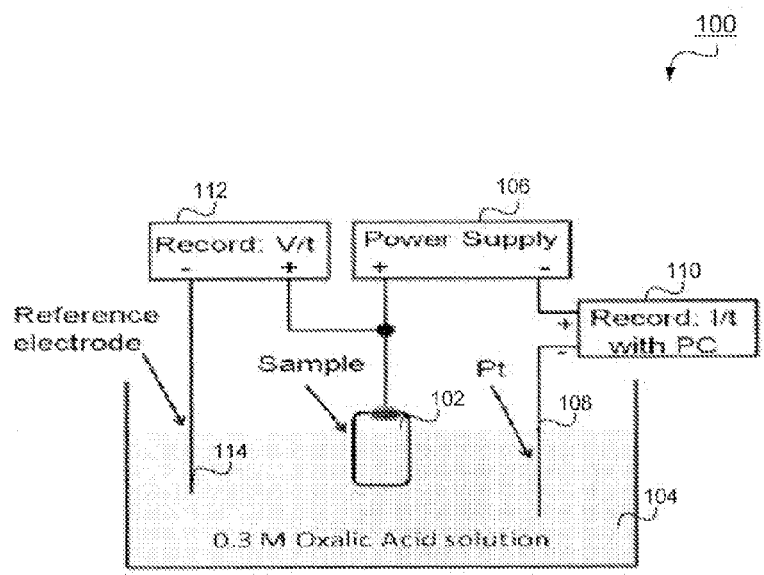
FIG. 1 is an illustration of the GaN electrochemical etch (EC) process, according to an embodiment of the invention.

The EC etching process according to embodiments of the invention is illustrated schematically in FIG. 1. In an embodiment, oxalic acid is used as an electrolyte 104 at room temperature. In other embodiments, other electrolytes such as KOH or HCL can be used. An n-type doped GaN sample 102 and a platinum wire 108 comprise an anode and cathode, respectively which are connected to a power supply 106 to form a circuit. The power supply 106 is used to energize the circuit that drives a current through the material, which modifies its physical properties and generates a porosity profile in the material. In various embodiments, either the current or voltage can be controlled by recording the current and voltage using measuring devices, shown as 110 and 112, and using a reference electrode 114 (e.g., made of Ag/AgCl) to monitor a potential difference between the reference and anode electrodes. As discussed in the following paragraph, voltages in the range 5-60 V and n-type GaN doping in the range $10^{18}$ to $10^{19}$ cm$^{-3}$ are typically employed.

Various time-dependent energizing techniques may be employed in which the voltage or current can be pulsed, ramped, or the like. In embodiments of this method, after the EC etching, samples can be rinsed in deionized water, methanol, and pentane, sequentially to minimize surface tension in the final drying process, which ensures complete dissolution of any residue etching chemicals.

Figure 2:
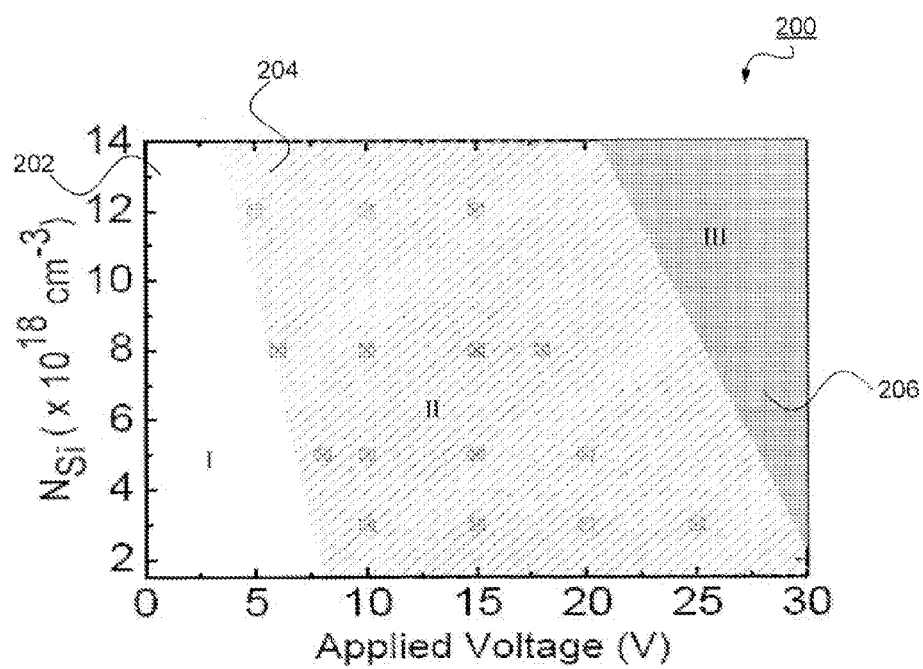
FIG. 2 is an illustration of the observed phase diagram for the EC process, according to an embodiment of the invention.

The EC etching process is controlled by the degree of n-type doping and the applied voltage as. The observed etching morphology is correlated with the applied voltage (5-30 V) and n-type GaN doping ($10^{18}$ to $10^{19}$ cm$^{-3}$). The concentration of the oxalic acid can be varied between 0.03 and 0.3 M with no strong dependence observed. The "phase diagram" of EC etching is shown in FIG. 2. Three regions are identified based on scanning electron microscopy (SEM) imaging, including no etching 202 (region I), formation of NP Ga 204 (II), and complete layer removal or electropolishing 206 (III, including voltages greater than 30 V), with increasing conductivity or applied voltage. In embodiments, EC etching can be performed at 10, 15, and 20 V on n-type GaN with a doping concentration in the range $10^{17}$ to $10^{19}$ cm$^{-3}$, for example.

Figures 3A, 3B, 3C, 3D:
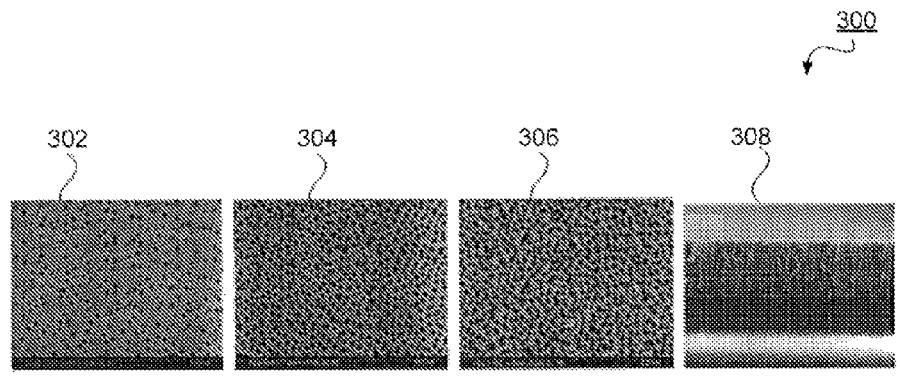

The NP GaN morphology resulting from the above described method is illustrated in FIGS. 3a-3c. FIGS. 3a-3c show plan-view SEM images NP GaN prepared at 10V (302), 15V (304) and 20V (306), respectively. FIG. 3d is a cross-sectional SEM image of a resulting NP GaN film 308 prepared at 15V.

Using the electrochemical process described above, one is able to vertically nano-drill through GaN layers and create GaN layers of different pore sizes and porosity, corresponding to layers with different indices of refraction. In embodiments, GaN multi-layer structures can be created by varying an applied voltage, current, or GaN doping profile. Layering structures with a designed index profile, including a quarter-wavelength distributed Bragg reflector (DBR), have many utilities for optical or biomedical applications.

Embodiments will now be described wherein useful opto-electronic structures and devices can be generated. GaN based opto-electronic devices can be used to solve problems in solid state lighting, displays, and power electronics. GaN-based vertical cavity surface emitting lasers (VCSELs) and resonant-cavity light-emitting diodes (RCLEDs) are examples of such devices. An important requirement for the operation of these devices is the need for high reflectance mirrors, usually in the form of distributed Bragg reflectors (DBRs). VCSELs require highly reflective DBR mirrors on both sides of the active region to form a laser cavity, while for the RCLEDs the high reflectance DBRs underneath the active region can improve output power and the emission spectrum. The DBR structures are particularly important for GaN VCSELs in two aspects. First, the threshold current density of a GaN VCSEL can be reduced by an order of magnitude with an increase of the DBR peak reflectance from 90% to 99%. Second, the DBRs should have large stop bandwidth. This is important because the active region of a GaN-based VCSEL is typically made of InGaN multiple quantum wells (MQWs), and the emission peak of the InGaN MQWs tends to fluctuate with small variations in either the growth conditions or the process parameters. A DBR with wide stop band can provide sufficient coverage of such spectral variation in emission wavelength.

Embodiments directed to methods of forming NP GaN multilayer structures are disclosed. FIG. 4 illustrates an embodiment utilizing the dependence of porosity on anodization parameters such as applied voltage or current density 402. For example as shown in FIG. 4a, by switching between a high 406 or low 402 voltage or current density during the anodization process, layers of high and low porosities (low and high refractive indices, respectively) can be obtained as shown in 408 of FIG. 4b. FIG. 4b illustrates a cross-sectional SEM image of a multilayer NP GaN obtained by switching between high and low voltage or current densities during the anodization process. Features 410 and 414 illustrate high porosity while features 412 and 416 illustrate low porosity of the resulting multi-layer structure.

FIG. 5 illustrates another embodiment utilizing the dependence of both pore morphology and porosity on the conductivity of an individual layer, which in turn can be controlled by doping concentration during epitaxial growth as shown in FIG. 5a. High 512 and low 510 porosity NP GaN layers can be obtained by doping the starting material with high 506 and low 504 doping regions, respectively as shown in FIG. 5b. In this case, a suitable porosity profile can be obtained using a constant voltage or current etching.

For the embodiments illustrated in FIGS. 4 and 5, the resulting effective dielectric function is rendered depth dependent, due to both the different porosities and GaN nanocrystal sizes remaining within the NP GaN layers. The former embodiment has the advantage of not requiring epitaxial growth to achieve layers of different dopant concentrations, yet the interface between low- and high-porosity GaN layers is sometimes rougher. The latter embodiment has the advantage of a precise control of the thickness and interface abruptness.

In another embodiment, a pulsed-etching method is used, to achieve very high porosity toward a very low refractive index, as illustrated in FIGS. 6a and 6b. This pulsed-etching is distinct from the modulation of refractive index at optical wavelength scale as was employed in the embodiments of FIGS. 4 and 5. The pulsed-etching method, illustrated in FIG. 6, comprises alternating between a high voltage 606 and low-voltage 604 (or zero voltage). Etching then proceeds with a repetitive cycle. The pulsed-etching technique is used to achieve a very high porosity region 612 as shown in the SEM micrograph in FIG. 6b, where the low porosity layer 610 is produced before the pulsed etching using a constant low voltage etching not shown in FIG. 6a.

Having established a control of the porosity in NP GaN, one can envision a new class of monocrystalline NP GaN layers with a tunable index of refraction. Examples of such materials are shown in feature 608 of FIG. 6b. Feature 608 illustrates four pieces of NP GaN epilayer on sapphire, for example. The change of index of refraction alters the optical cavity length, shifting the Fabry-Perot interference peak from sample to sample. Under white light illumination, these materials appear iridescent, exhibiting a range of colors including purple, green, orange, and pink, for example.

A NP GaN layer with about 30% porosity can produce an index contrast tantamount to that of an AlN layer, while the AlGaN cladding layers typically employed in 410-nm laser diodes (Al-15%, thickness-0.5 micron) can be replaced by NP GaN layers with about 5% porosity for effective waveguiding.

These embodiments provide a simple, flexible way to fabricate large-scale NP GaN multilayer for optical and biomedical applications. Advantages and applications thereof include: (1) GaN-based DBR pairs with increased refractive index contrast, (2) low cost GaN-based VCSELs and RCLEDs, (3) Fabry-Perot filters, (4) antireflection coatings for energy conversion, (5) optical biosensors, and (6) substrates for III-nitride materials and device growth.

Nanoporous Substrates for Device Applications

Further embodiments directed to methods of using NP substrates include techniques to: (1) make polar, nonpolar and semipolar NP III-Nitride structures on sapphire (or III-Nitride, SiC, Si, ZnO, $LiNbO_3$, $LiAlO_2$, etc.) substrates by electrochemical etching, (2) grow high quality polar, nonpolar and semipolar III-Nitride materials on NP structures, (3) fabricate polar, nonpolar and semipolar III-Nitride optoelectronic devices (LEDs, laser, etc.) and electronic devices such as high electron mobility transistors (HEMTs) using re-grown III-Nitride materials, and (4) produce polar, nonpolar and semipolar III-Nitride bulk substrates using the re-grown III-Nitride materials on NP III-Nitride structure by HVPE.

FIG. 7 illustrates a process flow along with experimental results of an embodiment that yields a NP GaN template that is suitable for device fabrication. In this embodiment one begins with a semipolar (1122) GaN surface grown using standard epitaxial techniques. Such a surface is shown in feature 702. Despite a high density of defects (dislocations—$3 \times 10^9$ $cm^{-2}$; stacking faults—105 $cm^{-1}$) such a surface is suitable for the fabrication of green-emitting LEDs, for example. A substrate with a greatly reduced density of defects, however, can be generated by applying an embodiment of the EC etching technique to produce a NP GaN surface as shown in feature 704 in plan view. A cross sectional image of this surface is shown in the lower right portion of FIG. 7. This image illustrates a multi-layer structure comprising a NP GaN layer 706 on top of a layer of non-porous GaN 708 grown on a sapphire substrate 710.

The NP GaN surface, illustrated in the upper and lower right portions of FIG. 7, provides a higher quality substrate on which to grow GaN with reduced defect densities. The process of growing high-quality GaN on a NP GaN template (substrate) is called "re-growth" and the result of such a re-growth process is illustrated in the lower left portion of FIG. 7 in which (1122) semipolar GaN has been re-grown. The EC porosification process is not sensitively dependent on the crystallographic orientations. The process described in FIG. 7 has been repeated on polar, nonpolar, and semipolar GaN layers, including the porosification and the re-growths.

Photonics Applications

FIG. 8 illustrates the application of previously disclosed embodiments for the fabrication of an InGaN/GaN active structure with enhanced light extraction properties due to the presence of a buried NP GaN layer (828 in FIG. 8c). Such a structure is formed by growing an InGaN/GaN active structure on a NP GaN template fabricated as discussed in the previous section and illustrated in FIG. 7. FIG. 8c illustrates an InGaN/GaN active region with a buried NP GaN layer 828, while FIG. 8b illustrates a more traditional InGaN/GaN active region structure.

FIG. 8c illustrates the sapphire substrate 826 on which an undoped GaN layer 824 and a NP GaN layer 828 has been grown. Another undoped GaN layer 822 is then grown above the NP layer followed by the multiple quantum well (MQW) structure 820 above that. The presence of the buried NP GaN layer 828 increases the scattering of light in the device 818 leading to enhanced light extraction.

FIG. 8b illustrates a traditionally grown InGaN/GaN active structure without the buried NP layer. In this structure, there is an undoped GaN layer 814 grown on a sapphire substrate 816 followed by the MQW LED structure 812 grown using standard techniques. Without the buried NP layer, the light suffers from multiple total internal reflections and re-absorption within 810 leading to less efficient light extraction.

FIG. 8a presents a plot of photoluminescence (PL) as a function of lateral distance from the laser spot. The three curves 804, 806, and 808 correspond to devices, fabricated according to embodiments disclosed above, comprising: no porous layer, a porous layer with 40 nm pore size, and 70 nm pore size respectively. This figure illustrates that light extraction efficiency with the buried NP layer is larger for the device with 70 nm pores in comparison with the other two devices.

FIG. 9 illustrates in more detail a device structure of an LED grown on a NP GaN template 906. The right side, in FIGS. 9b and 9c, shows the cross sectional SEMs of the LED grown on the NP layer and a close up of the transformed voids 932 underneath LED layers. Features 920 encompasses the device layers 908 through 912 of the schematic device in FIG. 9a, while the undoped layer 908 on the left can be seen in the micrograph on the right as feature 930. The NP layer 904 and 906 on the left is seen as the voided layer 932 on the right while the undoped GaN indicated by 902 on the left is seen as feature 934 in the micrograph.

Separation of Continuous Crystalline Layers

Figure 10A:
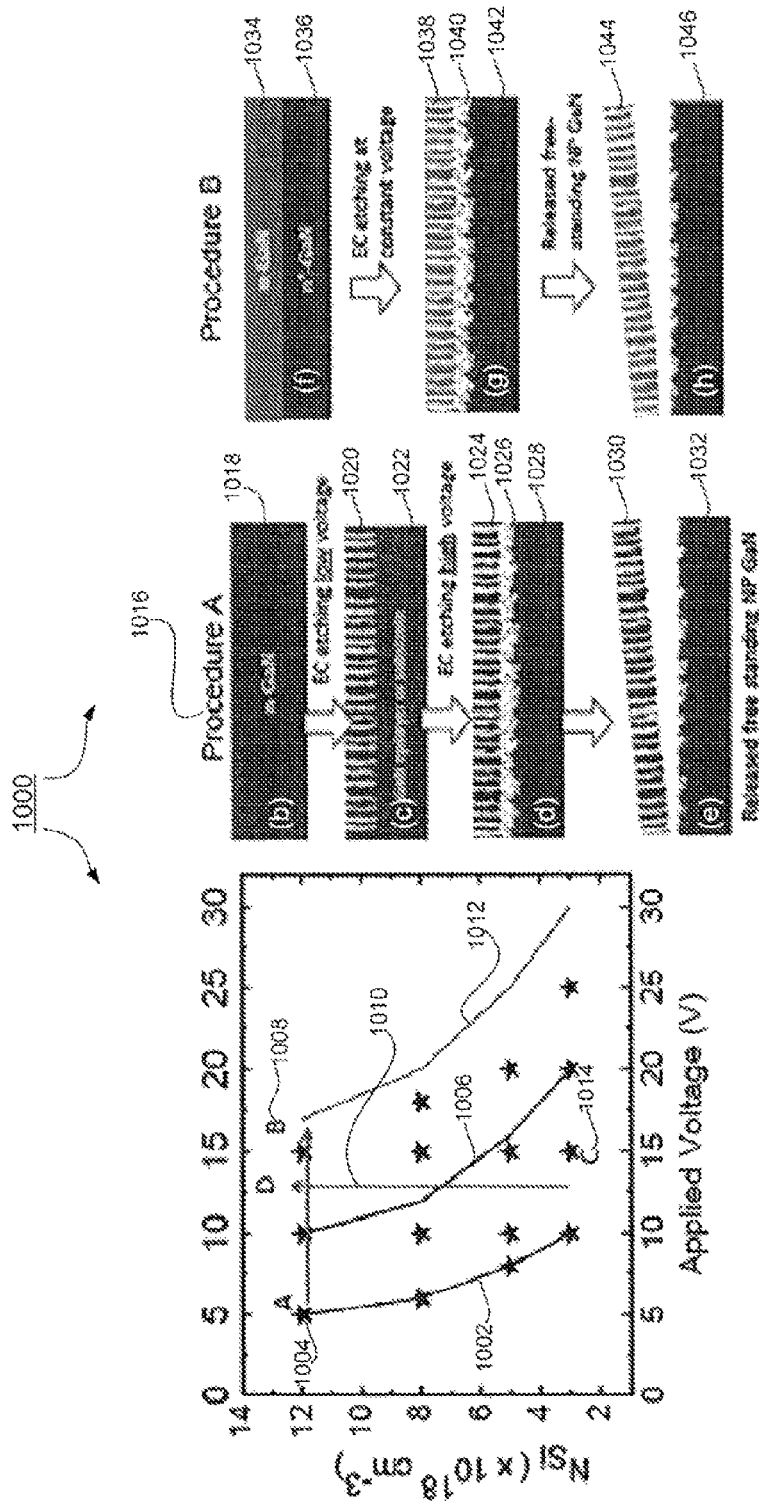

FIG. 10 illustrates further embodiments of the present invention for generating free-standing GaN membranes and layers. One embodiment is based on a uniformly doped GaN layer 1018, and proceeds with EC etching under a low-voltage condition (feature 1004 in FIG. 10*a*), resulting in the generation and vertical downward propagation of nanopores 1020 and 1024 with a low density (less than $10^9$ cm$^{-2}$) and small diameters (about 30 nm). Once a desirable thickness is achieved, corresponding to the thickness of the final membrane, the etching voltage is increased (from 1004 in FIG. 10*a*) corresponding to a lateral move of etching condition on the phase diagram (to point 1008 in FIG. 10*a*). This condition produces rapid branching and lateral etching of GaN into a high porosity layer 1026 underneath the low-porosity layer 1024. The formation and detachment of a continuous crystalline layer 1030 is illustrated schematically in FIGS. 10*b-e*.

Experimental results corresponding to the embodiments of FIG. 10 are illustrated in FIG. 11. The first and second voltage conditions were set to be 10 and 15 V, respectively. The etching rate during step one is 200 nm/min; a five-minute etching is sufficient to produce a low-porosity layer of around 1 micron in thickness. Upon increasing the voltage to 15V, the electrochemistry is accelerated with observation of bubbles generated at both GaN surface (anode) and the platinum counter electrode. The detachment of a GaN thin layer from sample edges was achieved in under one minute, as shown by features 1104, 1108, and 1112 in FIG. 11. Continuing the EC etching at 15V lead to the floating off of the entire layer over a large macroscopic area 1108. In this case the size of the thin layer that was detached was of order 1 cm$^2$ limited by the sample size as illustrated by features 1104, 1108, 1112 and 1116 in FIG. 11. The free-standing GaN thin film in solution was taken from solution and transferred to a glass slide 1116 (FIG. 10*b*). This procedure can conceivably be extended to larger wafers (e.g., 2 inches, or larger).

SEM images in FIG. 12 show the difference in porosity (1204 and 1206) observed from the surface of the NP GaN membrane. The horizontal arrow in FIGS. 12*a* and 12*b* shows that the detached membrane has a finer NP morphology 1206 than the remaining surface 1204. FIG. 12*d* shows an inclined SEM view of the edge of a free standing NP membrane indicating that the NP nature of the membrane is well preserved and the separation process is confined near the etching front 1214 above the GaN substrate 1216.

This realization enables us to design growth processes where we can grow GaN on a nanoporous template and quickly planarize the surface. Concurrently the buried nanoporous layer undergoes transformation to form large voids through which the attachment of the upper epitaxial layer to the underlying layer or substrate is greatly weakened. In other words we disclose a process of epitaxial growth of GaN layers and devices on a metastable nanoporous single-crystalline template, with a surface morphology sufficiently smooth to support initial nucleation and planarization. The metastable nanoporous GaN itself undergoes void formation in-situ with weakening bonding between the upper layers and the substrates. At the same time this transformation does not adversely affect the epitaxial process. After growth, the nanoporous GaN layer remains loosely attached to the substrate, an example is shown in FIG. 20 where a 2-μm GaN was grown on NP GaN. While the surface and upper portion of the GaN layer is perfect with device quality, the thermal annealing of the NP GaN creates a void and cleaved region, making the sample ready for layer transfer. Standard wafer bonding procedure can be applied, in this case by pressing a silicon wafer to the as-grown GaN/NP—GaN/sapphire sample with epoxy in between. No high-temperature curing is used in this case and the sample is left at room temperature overnight. Applying a lateral force (pry with a wedge-shape blade) causes the separation of the two substrates, namely silicon and sapphire. We observed, as shown in FIG. 21, complete transfer of 2-μm GaN unto a silicon substrate. As illustrated in FIG. 21. The area of the GaN epilayer transferred onto silicon is around 1 cm×1 cm in this proof-of-concept experiment.

An important point to emphasize is that macroscopic crystallinity, over hundreds or even thousands of micrometers, is preserved since the GaN layers or devices are mechanically supported throughout every step. In FIG. 22 we demonstrated x-ray diffraction rock curve measurement using GaN (002) diffraction. The as-grown GaN has a linewidth of 0.1° while the transferred thin film, now on silicon, has a linewidth of only 0.14°, over an area of 10 mm×5 mm.

Alternatively, in a further embodiment, GaN thin layers with engineered doping profiles can be conducive to a simpler EC etching procedure. This process is illustrated in of FIGS. 10*f-h*. In this embodiment (procedure B) a two-layer GaN structure with a lightly doped layer 1034 is grown on a heavily-doped layer 1036. With such an engineered profile, the EC etching process requires only a constant voltage. Under such conditions the NP etching proceeds spontaneously from 1014 to 1008 in FIG. 10*a*, traversing the phase diagram vertically to produce a similar effect. Very similar results have been observed (i.e., detachment of layer 1038 and 1044) like those illustrated in FIGS. 11 and 12. The use of embedded doping profile yields better control and flexibility given the contemporary advances in epitaxial techniques.

The above disclosed embodiments can provide a simple, large-area transfer of GaN epilayers for device fabrication that could dramatically lower the cost while enhancing their functionality. The only competing technique is laser lift-off (LLO) which is expensive, time-consuming, not scalable, and has a problematic yield.

Using a novel electrochemical process, we are able to (nano)drill through GaN layers and create buried high-porosity (or two layer) region. The buried high-porosity region undergoes transformation during thermal annealing and MOCVD growth into large bubbles and coalesced voids that will facilitate in-plane fracturing, layer separation, and epitaxial wafer transfer, a process that has never been proposed in GaN fabrication and is likely to change the paradigm in III-nitride material growth and device fabrication. Key steps include (1) electrochemical porosification (FIGS. 1-7), (2) annealing and transformation, (3) homoepitaxial nucleation, (4) III-nitride thin film or device growth, (5) post growth wafer bonding, (6) separation or de-bonding, and (7) surface smoothing and reclaiming. We note that the same concept can be implemented on Al$_2$O$_3$ (as an LLO replacement), SiC, Si, GaN and other substrates. This invention is to recycle the substrates used for III-nitride materials growth and devices fabrication, leading to reduced cost.

A two-step porosification process was developed to create a vertical profile with a high porosity region around 0.5 to 1 μm below the surface, protected (or sealed) by a low-porosity region (FIG. 23*e*). It is important to comment that the EC etching takes place selectively near the tips of the columnar pores (due to curvature-driven field concentration). As the porosification process proceeds into the GaN layer, the etching "front" becomes buried. By using a two-step etching with an initial low-voltage condition (such as Point 1 in the upper left corner of FIG. 24), followed by a high-voltage condition (Point 2 in FIG. 24), one can create a buried high-porosity layer at an arbitrarily designed depth through the initial nano-drilling under condition 1.

After annealing we observed the desirable morphology (FIG. 23O with a continuous, planar GaN surface on top of a nearly voided region. The upper GaN layer is "tethered" to the bottom GaN/substrate through a low density of nano-pillars ($\leq 10^8$ cm$^{-2}$) while its crystallinity is by no means compromised, in fact most likely improved through mass-transport based dislocation reduction.

The morphology shown in FIG. 23f is by no means optimal. Parameters such as starting porosity, thickness of the porous layer, annealing temperature/duration, carrier gas all affect the shape transformation. One very recent discovery by us is that the use of a very thin (<0.2 μm), high porosity buried layer helps a confined coalescence of pores into an nearly ideal airgap with the upper and lower layers joined by a low density (<$10^8$ cm$^{-2}$) of nanoposts (FIG. 25).

Applications of the disclosed embodiments include transfer of GaN on a silicon wafer to another template that has good thermal expansion match with GaN. One can prepare a thin GaN layer on very large silicon wafers (greater than about six inches), while maintaining pseudomorphism. This would be a unique approach to produce 6 inch, 8 inch or even 12 inch NP GaN substrates for future LED and transistor industry.

The ability to transfer thin films from one substrate to another has other useful device applications, such as transferring NP GaN LED thin films and transistors to flexible and/or transparent substrates. As another application, it is possible to transfer GaN thin layers from bulk HVPE-grown GaN substrates. As such, this approach would be a simple and inexpensive method to mass-produce dislocation-free NP GaN thin films.

Device Manufacturing Methods with Substrate Recycling

A further embodiment, shown in FIG. 13, illustrates the concept of substrate recycling for III-nitride materials and devices using NP GaN. Using the novel electrochemical process introduced above, one is able to form NP GaN layers 1304 of a desirable porosity profile. The nanoporous structures 1304 can be loaded back into epitaxial chamber for annealing and regrowth. The NP region undergoes transformation into large bubbles or voids 1310. Additional regrowth of GaN layers or devices 1312 will simultaneously produce a buried high-porosity region undergoes transformation 1310 during thermal annealing in which large bubbles coalesce to form voids 1314. Such voids facilitate in-plane fracturing, layer separation, and epitaxial wafer transfer.

A device structure 1322 can be grown (e.g., using a method such as MOCVD) on the NP substrate 1320. The device structure can be bonded to a carrier wafer 1324 and the combined device structure/carrier wafer system 1326/1328 can be separated from the NP substrate. The remaining NP substrate 1330 can be further smoothed and reclaimed so that the process can be repeated.

We note that the same concept can be implemented on Al$_2$O$_3$ (as an LLO replacement), SiC, Si, GaN and other substrates. This embodiment enables one to recycle the substrates used for III-nitride materials growth and device fabrication, leading to reduced cost.

The remaining surface is still NP, after wafer splitting, as shown previously in FIG. 12. A further embodiment provides a combination of annealing and epitaxial planarization processes that recover the smoothness of GaN on Al$_2$O$_3$ without the need of wafer polishing. The observed roughness comprises mounds with a height of 0.1-0.3 microns and area density 10$^9$ cm$^{-2}$. This level of roughness is similar to the roughened and transformed LT GaN buffer that is employed in the standard two-step MOCVD process. As the intrinsic crystallinity of these hills and mounds is preserved by the original GaN underlayers, defect-free coalescence of these mounds during high-temperature MOCVD growth takes place in 1 to 2 microns of growth, making the overall composite structure identical to the starting structure before EC porosification.

The same reclaiming cycle illustrated in FIG. 13 can be applied to both the GaN/Al$_2$O$_3$ composite system and bulk HVPE substrate provided that electrochemical porosification of HVPE GaN can be implemented. In FIG. 26 we demonstrated the formation of NP GaN on HVPE wafers acquired from Furukawa (n$\leq 10^{17}$ cm$^{-3}$). Using a similar EC etching process, we observed the formation of very ordered nanoporous GaN up to 6 μm in approximate 15 minutes (FIGS. 26a and 26b for plane- and inclined views, respectively, insets are close-ups). We feel this initial evidence provide a strong support to the prospect of smart-cutting the HVPE wafers in bringing down the cost and greatly increasing the equivalent production volume of HVPE wafers.

FIG. 27 Top view SEM of nanoporous GaN after liftoff top overgrowth GaN layer by epitaxial liftoff (left) and after liftoff GaN epilayer by electrochemical etching (right). FIG. 28 shows the Nomarski of GaN epilayer grown on recycled substrate, the optical smooth surface is obtained. FIG. 29 shows the cross section SEM image of ~2 mm GaN epilayer grown on recycled substrate. The interface between overgrowth GaN layer and remained GaN on Al$_2$O$_3$ is clearly seen, and a little few air bubbles were formed at the interface.

The above disclosed device manufacturing embodiments provide a simple, robust route to recycle the substrates for III-nitride thin film growth and device fabrication that can dramatically lower the cost while enhancing functionality.

Several economic advantages and applications of the disclosed substrate recycling methods include the following. These methods can dramatically reduce the price of III-nitride materials and the fabrication of devices, such as vertical LEDs. These methods are equally applicable for use with other common substrates (such as sapphire, SiC, Si, GaN, AlN etc.) used to grow III-nitride materials. These methods also enable the production of GaN-on-Insulator (GaNOI) structures for electronics applications as well as enabling the production of high quality GaN epilayers.

Nanotechnology Applications of Porous GaN

A further embodiment of the invention relates to the generation of NP GaN based nanocrystals. Using the electrochemical process disclosed in previous embodiments, fibrous-like monocrystalline GaN materials with greatly weakened mechanical strength, can be produced. The reduction in mechanical strength is due to a change in the aspect ratio and the greatly increased surface area of the fibrous-like materials. The NP GaN is more susceptible to mechanical fracturing and breaking through a sonication (or grinding) process into nanometer-size nanocrystals that are of interest in fluorescence-labeling, photovoltaics, display-lighting, and nanoelectronics.

An embodiment for producing GaN nanocrystals is illustrated in FIGS. 14a-e. A n-type GaN layer (can be an epilayer 1406 on sapphire 1402, or GaN substrate 1402, for example) is first porosified 1410 from the top surface using the EC etch embodiments disclosed above. A plan-view SEM image of a NP GaN is shown in 1418. The resulting NP GaN 1410 on sapphire 1416 is placed into a suitable solution 1426 (e.g., comprising water, polar or nonpolar solvents) and sonicated (in an example embodiment, for about two hours). After sonication, using standard techniques, the surface comprises GaN ridges and stumps 1422. At the end of the procedure the liquid becomes slightly turbid 1426, in contrast to the clear and transparent deionized water 1424.

The observed turbidity in the sonicated solution is due to the aggregate of GaN nanocrystals (NC) into micron-size particulates causing diffusive scattering. FIG. 15*b* shows a TEM image of such a particulate consisting of many GaN NCs 1512 and 1516. A higher magnification TEM image in FIG. 15*a* shows that these GaN NCs 1506 and 1510 have random orientations, indicating that the original NP GaN matrix has been sufficiently fractured. Finally, the dried GaN particulates exhibit characteristic photoluminescence emission peak 1522 and an absorption peak 1520 as shown in FIG. 15*c*.

A further embodiment of the porosification-sonication process incorporates a two-stage electrochemical etching process. The particular step required in EC porosification is to create a buried layer with very high porosity to undercut and release the upper NP GaN layer into a membrane form, as shown in FIG. 16*b* and disclosed above (FIG. 10*a-h*). The free-standing, floating NP GaN membrane 1610 can be transferred into a container as shown in FIG. 17*a*, and be sonicated into fine nanocrystals. A distinction between these embodiments is the form of the NP GaN at the start of sonication: in the previous embodiment, the NP GaN is epitaxially attached to the substrate, while in the embodiment of FIG. 15 the NP GaN film/membrane is floating in solution and is more susceptible to sonication-based fracturing. The optical activity of these sonicated GaN NCs can be observed by the visual fluorescence emitted when the sample was irradiated by UV light as seen in FIG. 17*c*.

The above embodiments provide an elegant method to produce colloidal GaN and InGaN nanocrystals. Economic advantages and possible applications to this new technique include but are not limited to: fabricating light emitting diodes or Laser diodes using nanocrystals, use of nanocrystals as fluorescent biological labels for biomedical applications, use of nanocrystal GaN or InGaN Hybrids with polymers for photovoltaic applications, and use of nanocrystal GaN or InGaN hybrids with catalytic metal (like gold, nickel, etc.) for energy applications.

A further embodiment relates to the use of NP GaN and NP InGaN as the photoanode or photo-cathode in photosynthetic processes, water splitting, and hydrogen production. The electrochemical etching process used to produce NP GaN was described above. The use of NP GaN or NP InGaN has the advantages of (1) enhanced photon absorption, (2) improved photosynthetic efficiency, and (3) reduced photo electrode degradation.

Factors such as heteroepitaxial strain (11% mismatch between InN and GaN), dislocations, nanoscopic morphology such as faceting/roughening, and surface kinetics, are all responsible for the complex interplay. An emerging consensus is that the interaction of the aforementioned factors could lead to a macroscopic (over the length scale of 50~100 nm) inhomogeneous distribution of In composition in InGaN epilayer or quantum well, producing fluctuations in the bandgap of a few hundreds of meV (~400 meV). Furthermore, regions with high band gaps (or low In compositions) tend to coincide with the presence of non-radiative dislocations due to either reduced incorporation or enhanced desorption of Indium. Carriers are therefore localized in regions away from dislocations. Such a self-screening process is thought to be crucial in achieving high IQE. The growth of InGaN under "optimal" conditions to induce nonplanar and inhomogeneous incorporations of Indium has been the conventional approach adopted by many companies and may be reaching its limitation.

In this invention, we explore the growth of InGaN on an inherently three-dimensional (3D) and nanoporous (NP) GaN template. The preparation of NP GaN by an electrochemical etching was described in an earlier provisional disclosure (61/326,722 disclosed on Apr. 22, 2010). We feel the new NP GaN template offers advantages for the preparation of InGaN active medium over conventional planar GaN templates in the following ways: 1) The NP GaN provides numerous crystallographic facets concurrently over nanometer scale; this will accentuate the disparity and anisotropy in the incorporation of Indium and enhance the localization effect. 2) The NP GaN template, with its percolated nature, would provide a built-in, in-plane localization based on geometry. 3) The NP GaN is likely to have a reduced density of dislocations. 4) The NP GaN template, with its fibrous nature and a very high surface-to-volume ratio, will help to relieve heteroepitaxial strains during InGaN growth.

To test this idea, we have grown InGaN (0.2 μm) on NP GaN with different porosities (~40 nm and ~60 nm pores), as well as a standard planar GaN template. The NP GaN and standard planar GaN templates were loaded into a MOCVD reactor, heated briefly to 1000° C. in a $H_2/NH_3$ mixture for cleaning, then lowered to 820° C. in $H_2/NH_3$ when growth of InGaN commenced after temperature stabilization. FIG. 30 shows inclined views by SEM of InGaN epilayers grown on planar GaN (left) and on a ~60 nm nanoporous matrix directly (right image). The nonplanar nature of the InGaN is clearly seen.

The photoluminescence spectra of the 3 samples are shown in FIG. 31. There is a pronounced red shift of InGaN grown on NP templates, from around 420 nm to 540 nm. This suggests the creation of high In-containing regions under identical conditions. The integrated PL intensity for InGaN grown on NP templates is consistently brighter, up to ~5 times, while the wavelength is 120 nm longer. The much-increased FWHM also suggests the enhanced effect of compositional inhomogeneity. The enhanced incorporation of Indium is independently confirmed by XRD. We note the growth of InGaN on NP GaN, through an intermediate GaN buffer, has been patented previously by Chua et al. However, the present work offers advantages (1)-(4) that were not considered or disclosed in Chua's patent.

The advantages of InGaN layers grown directly on nanoporous GaN have been listed above in Section II.C. Possible impacts of this invention may include: 1. The fabrication of long wavelength (green, yellow, amber, and red) LEDs with high efficiency to overcome the so-called "green-gap" issue. 2. A solution of efficiency droop in InGaN LEDs. 3. Applications in the fields of high efficiency Photovoltaic devices (solar cell, photoelectrochemical cell, et al.)

FIG. 18 illustrates the experimental apparatus for a water splitting experiment using a NP GaN or InGaN electrode 1808 as an anode. In this embodiment, a NP InGaN or GaN electrode is first fabricated using the EC etch procedure disclosed above. Such an anode is placed in water 1812 and connected to a metal (e.g., Pt) electrode 1810 so as to form a circuit. Solar radiation or radiation from another source, such as a Hg(Xe) lamp 1806 incident on the anode, drives an electrochemical reaction and produces water splitting with the liberation of oxygen 1814 and hydrogen 1815.

The use of NP GaN or NP indium gallium nitride (InGaN) has the advantages of 1) enhanced photon absorption, 2) improved photosynthetic efficiency, and 3) reduced photoelectrode degradation. Water splitting Experiments. Electrolyte: 1M NaCl, 1M KOH, 1M HCL. Light source: 200 W Hg(Xe) lamp focused onto 1×1 cm² spot. Nanoporous GaN.

increased surface area. Better chance for photo-excited carriers to reach semiconductor-electrolyte interface.

Nanoporous GaN was used as a photoanode for WS. Improved WS efficiency. No photocurrent saturation at large bias. Increased surface area. Light scattering by nanoporous structure. Enhanced PC stability. Distributed WS reaction on nanopore walls. Immune to the PEC etching near top surface. Nanoporous GaN is an important photoanode material for WS. Better efficiency under concentrated solar light. FIG. 32 illustrates gallium nitride and nanoporous gallium nitride photoanodes for water splitting showing surface corrosion during water splitting. Photo-enhanced electrochemical etching was observed and different etching morphology from nanoporous etching.

An advantage of using a NP anode is illustrated in measurements presented in FIG. 19. The use of a NP anode leads to greatly reduced current saturation 1904 as compared to the situation in which the electrode is not porous 1902. The NP electrode effectively has a higher surface area that gives a better chance that photo-excited carriers will reach the semiconductor/electrolyte interface leading to higher conversion efficiency.

CONCLUSION

It is to be appreciated that the Detailed Description section, and not the Summary and Abstract sections, is intended to be used to interpret the claims. The Summary and Abstract sections may set forth one or more but not all exemplary embodiments or advantages of the present invention as contemplated by the inventor(s), and thus, are not intended to limit the present invention and the appended claims in any way.

The foregoing description of the specific embodiments will so fully reveal the general nature of the invention that others can, by applying knowledge within the skill of the art, readily modify and/or adapt, for various applications, such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method for forming porous GaN, comprising:
exposing GaN to an electrolyte;
coupling the GaN to one terminal of a power supply and coupling an electrode immersed in the electrolyte to another terminal of the power supply to thereby form a circuit; and
energizing the circuit to electrochemically (EC) etch a plurality of pores in at least a first portion of the GaN and thereby form porous GaN, wherein electrochemically etching the plurality of pores does not require ultraviolet illumination of the GaN.

2. The method of claim 1, further comprising applying a voltage in the range between 5V and 60V, wherein the GaN is coupled to the positive terminal of the power supply.

3. The method of claim 1, further comprising forming the first portion of GaN on a substrate comprising sapphire, silicon, silicon carbide, or bulk GaN.

4. The method of claim 1, further comprising doping the first portion of the GaN in the range from $10^{17}$ to $10^{19}$ cm$^{-3}$, and providing the electrolyte as KOH or HCl.

5. The method of claim 1, further comprising doping the first portion of the GaN in the range from $10^{17}$ to $10^{19}$ cm$^{-3}$, and providing the electrolyte as oxalic acid.

6. The method of claim 5, further comprising applying a voltage in the range between 5V and 60V, wherein the doped GaN is coupled to the positive terminal of the power supply.

7. The method of claim 5, wherein the energizing further comprises controlling an applied voltage or current to adjust the GaN porosity.

8. The method of claim 5, further comprising forming a doping profile in the GaN prior to the energizing to generate a corresponding porosity profile.

9. The method of claim 8, wherein the energizing further comprises controlling an applied voltage between a low and high value in the range between 0V and 60V as a function of time to generate the porosity profile.

10. The method of claim 1, further comprising:
providing the electrolyte as oxalic acid;
coupling the GaN to the positive terminal of the power supply; and
applying a voltage in the range between 0V and 60V.

11. The method of claim 10, further comprising switching the voltage between a low and high value in the range between 0V and 60V as a function of time to generate a porosity profile.

12. The method of claim 10, further comprising forming an n-type multi-layer doping profile in the first portion of GaN, wherein the energizing generates a porosity profile with a refractive index periodicity of a quarter-wavelength distributed Bragg reflector (DBR).

13. The method of claim 11, further comprising forming a uniform n-type doping in the first portion of GaN, wherein the energizing causes the porosity profile to have a refractive index periodicity of a quarter-wavelength distributed Bragg reflector (DBR).

14. The method of claim 12, further comprising forming an undoped or uniformly doped GaN structure between two such DBRs to form a Fabre-Perot optical filter.

15. The method of claim 13, further comprising forming an undoped or uniformly doped GaN structure between two such DBRs to form a Fabre-Perot optical filter.

16. The method of claim 11, further comprising doping the first portion of GaN to form a doped surface layer in the GaN, wherein the energizing transforms the doped surface layer into a nanoporous (NP) surface layer to enhance light extraction.

17. The method of claim 11, further comprising:
forming a doping profile in the first portion of GaN; and
etching the first portion of GaN to form a NP template.

18. The method of claim 1, further comprising forming on the etched portion of the GaN:
an n-type GaN layer,
a p-type GaN layer, and
InGaN/GaN active layers between the n-type GaN layer and the p-type GaN layer to form a light emitting diode (LED).

19. The method of claim 8, further comprising
etching the first portion of GaN material to form a first, low-porosity, continuous crystalline layer, and a second, high porosity layer underneath the first layer, wherein the second layer is mechanically weakened to facilitate the separation of the first low-porosity, continuous crystalline layer from the substrate.

20. The method of claim 9, further comprising
etching the first portion of GaN material to form a first, low-porosity, continuous crystalline layer, and a second, high porosity layer underneath the first layer, wherein the second layer is mechanically weakened to facilitate the separation of the first low-porosity, continuous crystalline layer from the substrate.

21. The method of claim 11, further comprising:
forming a doping profile in the GaN material; and
etching the first portion of GaN material to form a first, low-porosity, continuous crystalline layer, and a second, high porosity layer underneath the first layer, wherein the second layer is mechanically weakened to facilitate the separation of the first low-porosity, continuous crystalline layer from the substrate.

22. The method of claim 21, wherein the forming further comprises doping the first portion of GaN uniformly at a concentration value ranging from $10^{18}$ to $10^{19}$ cm$^{-3}$, and the etching comprises
applying a first voltage $V_1$ for a first time duration $T_1$; and
applying a second voltage $V_2$ for a second time duration $T_2$.

23. The method of claim 22, wherein the concentration value is $5 \times 10^{18}$ cm$^{-3}$, $V_1$ is 10V for the first time duration $T_1$ of 5 minutes, and $V_2$ is 15V for the second time duration $T_2$ of 1 minute.

24. The method of claim 19, further comprising:
doping the first portion of GaN to form a first layer with a first doping concentration $N_1$ and a second layer of doping concentration $N_2$; and
applying the voltage at a fixed value for a fixed period of time.

25. The method of claim 24, further comprising:
doping the first portion of GaN with concentrations $N_1=3\times 10^{18}$ cm$^{-3}$, and $N_2=1\times10^{19}$ cm$^{-3}$; and
applying the voltage at 12V for 5 minutes.

26. The method of claim 19, further comprising continuing the etching process until the low-porosity continuous crystalline layer has completely separated from the substrate in electrolyte.

27. The method of claim 20, further comprising continuing the etching process until the low-porosity continuous crystalline layer has completely separated from the substrate in electrolyte.

28. The method of claim 21, further comprising continuing the etching process until the low-porosity continuous crystalline layer has completely separated from the substrate in electrolyte.

29. The method of claim 19, further comprising
stopping the etching process before the low-porosity continuous crystalline layer has separated from the substrate in electrolyte;
wafer bonding the low-porosity continuous crystalline layer to a target wafer or a polymer stamp; and
mechanically detaching the bonded low-porosity continuous crystalline layer from the substrate.

30. The method of claim 19, wherein the GaN is disposed on a substrate comprising sapphire, silicon, silicon carbide, or bulk GaN.

31. The method of claim 1, further comprising:
annealing the porous GaN;
forming a device or epitaxial structure on the porous GaN using epitaxial growth techniques;
bonding a carrier wafer to a surface of the device or epitaxial structure; and
cleaving, at the porous GaN, the device or epitaxial structure and the carrier wafer from a second portion of the GaN.

32. The method of claim 31, further comprising:
polishing the second portion of the GaN; and
repeating the acts of: exposing GaN to an electrolyte, coupling the GaN to one terminal of a power supply, energizing the circuit, annealing the porous GaN, forming a device or epitaxial structure, bonding a carrier wafer, and cleaving, at the porous GaN, the device or epitaxial structure.

33. The method of claim 31, further comprising forming the GaN on a substrate comprising sapphire, silicon, silicon carbide, or bulk GaN.

34. The method of claim 31, wherein forming the device comprises using an epitaxial method that is one of MOCVD, HVPE or MBE.

35. The method of claim 20, further comprising:
stopping the etching process before the low-porosity continuous crystalline layer has separated from the substrate in electrolyte;
bonding the low-porosity continuous crystalline layer to a target wafer or a polymer stamp; and
mechanically detaching the bonded low-porosity continuous crystalline layer from the substrate.

36. The method of claim 20, further comprising forming the GaN on a substrate comprising sapphire, silicon, silicon carbide, or bulk GaN.

37. The method of claim 9, further comprising:
annealing the porous GaN;
forming a device or epitaxial structure on the porous GaN using epitaxial growth techniques;
bonding a carrier wafer to a surface of the device or epitaxial structure; and
cleaving, at the porous GaN, the device or epitaxial structure and the carrier wafer from a second portion of the GaN.

38. The method of claim 37, further comprising:
polishing the second portion of the GaN; and
repeating the acts of: exposing GaN to an electrolyte, coupling the GaN to one terminal of a power supply, energizing the circuit, annealing the porous GaN, forming a device or epitaxial structure, bonding a carrier wafer, and cleaving, at the porous GaN, the device or epitaxial structure.

39. The method of claim 37, further comprising forming the GaN on a substrate comprising sapphire, silicon, silicon carbide, or bulk GaN.

40. The method of claim 37, wherein forming the device comprises using an epitaxial method that is one of MOCVD, HVPE or MBE.

41. The method of claim 21, further comprising
stopping the etching process before the low-porosity continuous crystalline layer has separated from the substrate in electrolyte;
bonding the low-porosity continuous crystalline layer to a target wafer or a polymer stamp; and
mechanically detaching the bonded low-porosity continuous crystalline layer from the substrate.

42. The method of claim 21, further comprising forming the GaN on a substrate comprising sapphire, silicon, silicon carbide, or bulk GaN.

43. The method of claim 11, further comprising:
annealing the porous GaN;
forming a device or epitaxial structure on the porous GaN using epitaxial growth techniques;

bonding a carrier wafer to a surface of the device or epitaxial structure; and cleaving, at the porous GaN, the device or epitaxial structure and the carrier wafer from a second portion of the GaN.

44. The method of claim 43, further comprising:
polishing the second portion of the GaN; and
repeating the acts of: exposing GaN to an electrolyte, coupling the GaN to one terminal of a power supply, energizing the circuit, annealing the porous GaN, forming a device or epitaxial structure, bonding a carrier wafer, and cleaving, at the porous GaN, the device or epitaxial structure.

45. The method of claim 43, further comprising forming the GaN on a substrate comprising sapphire, silicon, silicon carbide, or bulk GaN.

46. The method of claim 43, wherein forming the device comprises using an epitaxial method that is one of MOCVD, HVPE or MBE.

47. A method of manufacturing nanocrystals, comprising:
providing a material comprising at least one of GaN or InGaN with an n-type doped surface layer;
exposing the material to an electrolyte;
coupling the material to one terminal of a power supply and an electrode immersed in the electrolyte to another terminal of the power supply to thereby form a circuit;
energizing the circuit to electrochemically (EC) etch the doped surface layer and create a continuous porous layer at a surface of the material, wherein electrochemically etching the doped surface layer does not require ultraviolet illumination of the GaN; and,
subjecting the continuous porous layer to a mechanical disturbance to break the continuous porous layer into nanocrystals.

48. The method of claim 47 further comprising using a sonicator to provide the mechanical disturbance.

49. A method of manufacturing an electrode, comprising:
providing a material comprising at least one of GaN or InGaN with an n-type doped surface layer;
exposing the material to an electrolyte;
coupling the material to one terminal of a power supply and an electrode immersed in the electrolyte to another terminal of the power supply to thereby form a circuit; and,
energizing the circuit to electrochemically (EC) etch the doped surface layer and create a porous layer on the surface of a structure suitable for use as an electrode for electrolysis, water splitting, or photosynthetic process applications, wherein electrochemically etching the doped surface layer does not require ultraviolet illumination of the GaN.

50. A method of efficient solar water splitting, comprising:
providing an anode of porous GaN or InGaN electrode manufactured according to the method of claim 49;
providing a metal cathode electrode;
exposing the anode and the cathode to an electrolyte;
electrically connecting the anode and the cathode so as to form an electrical circuit; and,
exposing the anode to solar radiation so as to induce a photo-current in the circuit and thereby drive a photochemical water splitting chemical reaction.

51. A method for generating porous GaN, comprising:
forming a GaN layer on a substrate comprising sapphire, silicon, silicon carbide, or bulk GaN; and
electrochemically (EC) etching the GaN layer under a bias voltage between 5 volts and 60 volts to form a porous layer in at least a portion of the GaN layer, wherein electrochemically etching the GaN layer does not require ultraviolet illumination of the GaN.

* * * * *